(12) United States Patent
Kim et al.

(10) Patent No.: US 10,411,016 B2
(45) Date of Patent: Sep. 10, 2019

(54) SEMICONDUCTOR DEVICE

(71) Applicant: SAMSUNG ELECTRONICS CO., LTD., Suwon-si, Gyeonggi-do (KR)

(72) Inventors: Ye Ram Kim, Suwon-si (KR); Won Chul Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/043,619

(22) Filed: Jul. 24, 2018

(65) Prior Publication Data

US 2018/0331112 A1 Nov. 15, 2018

Related U.S. Application Data

(63) Continuation of application No. 15/668,847, filed on Aug. 4, 2017, now Pat. No. 10,032,778.

(30) Foreign Application Priority Data

Dec. 19, 2016 (KR) .................. 10-2016-0173482

(51) Int. Cl.
*H01L 27/108* (2006.01)
*H01L 49/02* (2006.01)

(52) U.S. Cl.
CPC .. *H01L 27/10852* (2013.01); *H01L 27/10814* (2013.01); *H01L 28/56* (2013.01); *H01L 28/87* (2013.01); *H01L 28/91* (2013.01)

(58) Field of Classification Search
CPC ......... H01L 27/10808; H01L 27/10814; H01L 27/10852; H01L 28/56; H01L 28/87; H01L 28/91
See application file for complete search history.

(56) References Cited

U.S. PATENT DOCUMENTS

| | | | |
|---|---|---|---|
| 7,871,891 B2 | 1/2011 | Cho et al. | |
| 8,835,315 B2 | 9/2014 | Byun et al. | |
| 9,087,729 B2 | 7/2015 | Park et al. | |
| 9,871,093 B2 | 1/2018 | Kim et al. | |
| 2012/0049380 A1* | 3/2012 | Kim .................. | H01L 27/10852 257/773 |
| 2012/0104559 A1* | 5/2012 | Kim ...................... | H01L 28/90 257/618 |

(Continued)

*Primary Examiner* — Cuong Q Nguyen
(74) *Attorney, Agent, or Firm* — F. Chau & Associates, LLC

(57) ABSTRACT

A semiconductor device includes a substrate, a plurality of lower electrodes disposed on the substrate and are repeatedly arranged in a first direction and in a second direction that crosses the first direction, and a first electrode support contacting a sidewall of at least one of the lower electrodes. The first electrode support includes a first support region including a first opening and a second support region disposed at a border of the first support region. An outer sidewall of the first electrode support includes a first sidewall extending in the first direction, a second sidewall extending in the second direction, and a connecting sidewall connecting the first and second sidewalls. The second support region includes the connecting sidewall. In a first portion of the second support region, a width of the first portion of the second support region decreases in a direction away from the first support region.

20 Claims, 19 Drawing Sheets

(56) References Cited

U.S. PATENT DOCUMENTS

2012/0235279 A1* 9/2012 Seo .................. H01L 27/10852
257/532
2016/0365409 A1* 12/2016 Lee ........................ H01L 28/90
2017/0236894 A1* 8/2017 Kim .................. H01L 27/10808
257/532
2018/0175041 A1 6/2018 Kim et al.

* cited by examiner

SEMICONDUCTOR DEVICE

CROSS-REFERENCE TO RELATED APPLICATION

This application is a continuation of U.S. application Ser. No. 15/668,847, filed on Aug. 4, 2017, which claims priority under 35 U.S.C. § 119 to Korean Patent Application No. 10-2016-0173482, filed on Dec. 19, 2016, in the Korean Intellectual Property Office, the disclosure of which is incorporated by reference herein in its entirety.

TECHNICAL FIELD

The present disclosure relates to a semiconductor device, and more particularly, to a semiconductor device including an elongated conductive electrode and a support structure supporting the conductive electrode.

DISCUSSION OF THE RELATED ART

Recently, the sizes of semiconductor devices are decreasing while their capacity is increasing. A semiconductor device such as a dynamic random-access memory (DRAM) may need a certain level of capacitance in each cell.

Research is being conducted on a method of using a dielectric film having a high dielectric constant for a capacitor or increasing a contact area between a lower electrode of the capacitor and the dielectric film. For example, when a height of the lower electrode increases, a contact area between the capacitor and the dielectric film may increase. Accordingly, the capacitance of the capacitor may also increase.

As a height of the lower electrode increases, a probability that the lower electrode tilts or breaks-off increases.

SUMMARY

According to an exemplary embodiment of the inventive concept, a semiconductor device includes a substrate, a plurality of lower electrodes disposed on the substrate, wherein individual lower electrodes of the plurality of lower electrodes are repeatedly arranged in a first direction and in a second direction that crosses the first direction, and a first electrode support contacting a sidewall of at least one of the lower electrodes to support the at least one of the lower electrodes. The first electrode support includes a first support region and a second support region disposed at a border of the first support region, wherein the first support region includes a first opening. An outer sidewall of the first electrode support includes a first sidewall extending in the first direction, a second sidewall extending in the second direction, and a connecting sidewall connecting the first sidewall with the second sidewall. The second support region includes the connecting sidewall. In a first portion of the second support region, a width of the first portion of the second support region decreases in a direction away from the first support region.

According to an exemplary embodiment of the inventive concept, a semiconductor device includes a substrate includes a cell region and a peripheral region, a plurality of first lower electrodes disposed on the cell region, wherein individual first lower electrodes of the plurality of first lower electrodes are repeatedly arranged in a first direction and in a second direction that crosses the first direction, a plurality of second lower electrodes disposed on the peripheral region, wherein individual second lower electrodes of the plurality of second lower electrodes are repeatedly arranged in the first direction and in the second direction, a first electrode support in contact with a sidewall of at least one of the first lower electrodes to support the at least one of the first lower electrodes, and a second electrode support in contact with a sidewall of at least one of the second lower electrodes to support the at least one of the second lower electrodes. An outer sidewall of the first electrode support includes a first sidewall extending in the first direction, a second sidewall extending in the second direction, and a first connecting sidewall connecting the first sidewall with the second sidewall. A boundary of an upper surface of the first electrode support, corresponding to the first connecting sidewall, extends in a third direction, wherein the third direction crosses the first and second directions.

According to an exemplary embodiment of the inventive concept, a semiconductor device includes a substrate including a cell region, wherein the cell region includes one or more cell blocks, and a plurality of lower electrodes disposed on the substrate in each of the one or more cell blocks. In each of the one or more cell blocks, individual lower electrodes of the plurality of lower electrodes are repeatedly arranged in a first direction and in a second direction that is perpendicular to the first direction. An electrode support disposed in each of the one or more cell blocks. In each of the one or more cell blocks, a shape of the electrode support is substantially the same as a shape of the cell block. In each of the one or more cell blocks, the electrode support contacts a sidewall of at least one of the lower electrodes to support the at least one of the lower electrodes. In at least one of the one or more cell blocks, an outer sidewall of the electrode support includes a first sidewall extending in the first direction, a second sidewall extending in the second direction, and a connecting sidewall connecting the first sidewall with the second sidewall. In the at least one of the one or more cell blocks, a boundary of an upper surface of the electrode support, corresponding to the connecting sidewall, extends in a third direction, wherein the third direction crosses the first and second directions.

According to an exemplary embodiment of the inventive concept, a semiconductor device includes a substrate, a plurality of lower electrodes disposed on the substrate, wherein the plurality of lower electrodes is arranged in a plurality of rows and in a plurality of columns, wherein each of the rows extends in a first direction and each of the columns extends in a second direction perpendicular to the first direction, and a first electrode support. The first electrode support includes a first support region and a second support region disposed at a border of the first support region, wherein the first support region includes at least one opening and wherein the second support region includes no openings. The first electrode support contacts a sidewall of a first lower electrode of the lower electrodes at the first supporting region, and the first electrode support contacts a sidewall of a second lower electrode of the lower electrodes at the second supporting region. The at least one opening exposes at least two of the lower electrodes. An outer sidewall of the first electrode support includes a first sidewall extending in the first direction, a second sidewall extending in the second direction and a third sidewall connecting the first sidewall with the second sidewall. The second support region includes the third sidewall. In a first portion of the second support region that includes the third sidewall, a width of the first portion of the second support region decreases in a direction away from the first support region.

BRIEF DESCRIPTION OF THE DRAWINGS

The above and other features of the inventive concept will become more apparent by describing in detail exemplary embodiments thereof in conjunction with the accompanying drawings, in which.

DETAILED DESCRIPTION OF THE EMBODIMENTS

Figure 1:
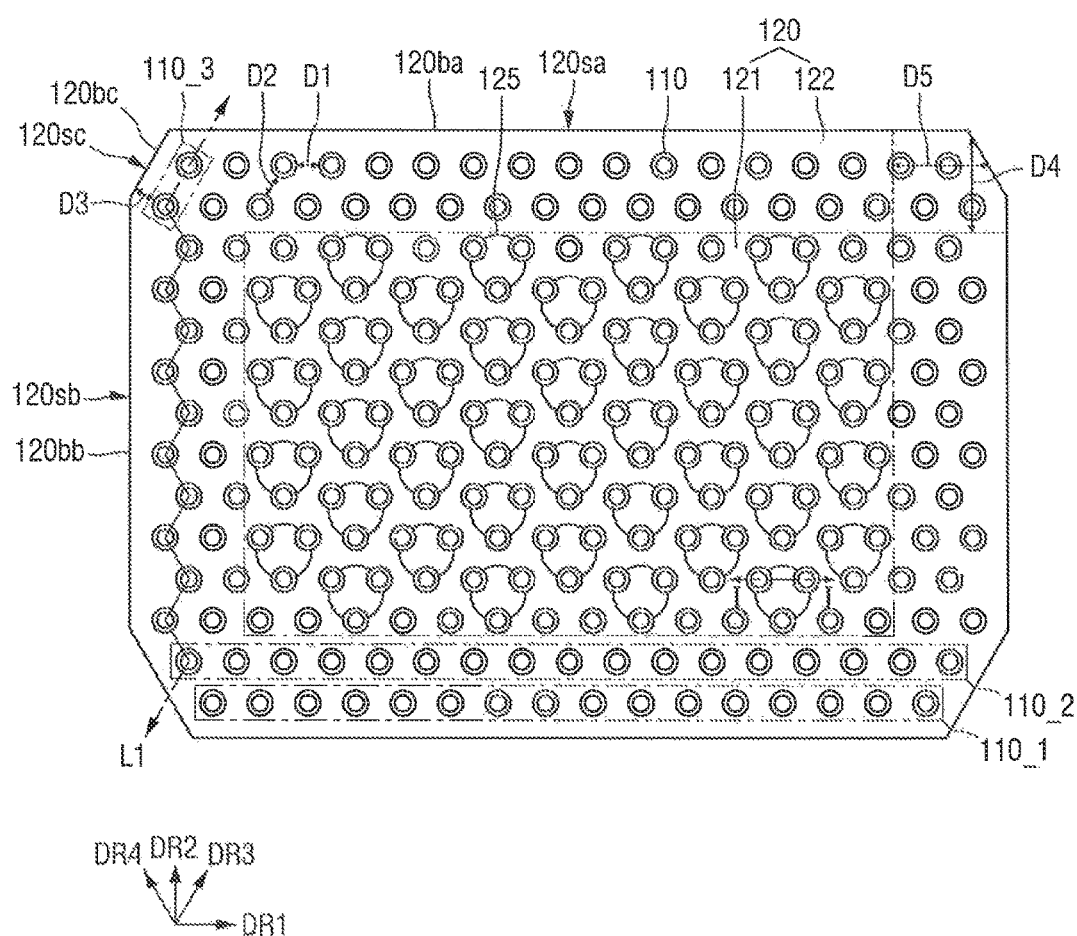
FIG. 1 is a plan view illustrating a lower electrode and an electrode support of a semiconductor device according to an exemplary embodiment of the inventive concept.

Exemplary embodiments of the inventive concept will be described more fully hereinafter with reference to accompanying drawings. Like reference numerals may refer to like elements throughout the specification. When an element is described as being on another element, the element may be directly disposed on the other element or intervening elements may be disposed therebetween.

The semiconductor devices described below may be, for example, dynamic random access memory (DRAM) devices.

Figure 2:
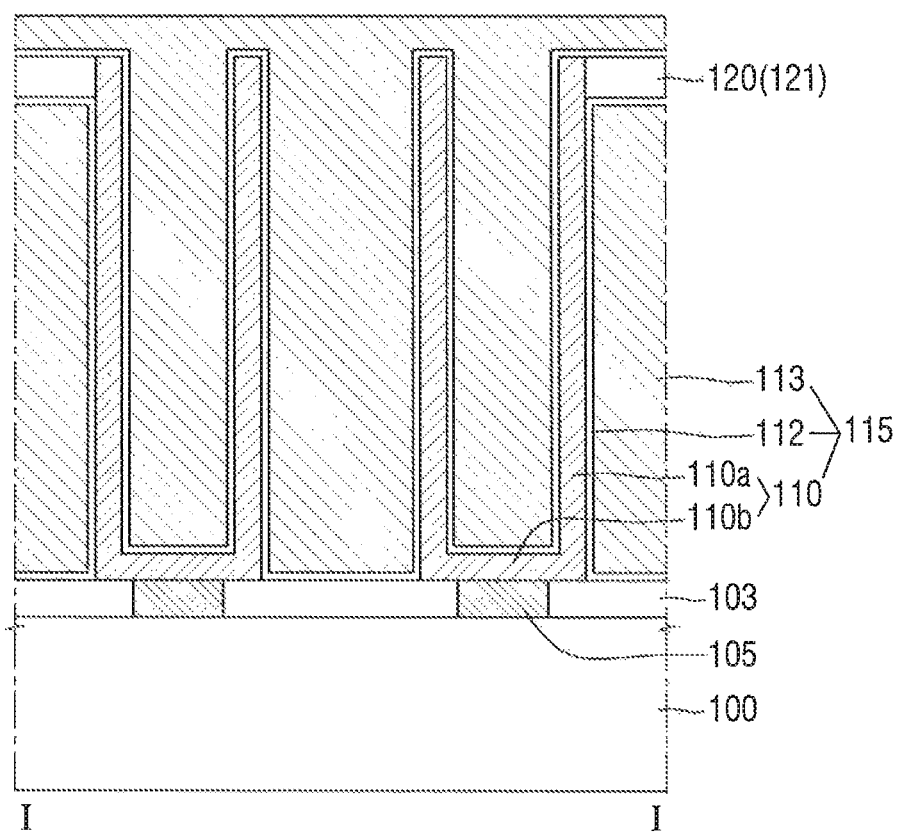
FIG. 2 is a cross-sectional view taken along line I-I of FIG. 1, according to an exemplary embodiment of the inventive concept.

FIG. 1 is a plan view illustrating a lower electrode and an electrode support of a semiconductor device according to an exemplary embodiment of the inventive concept. FIG. 2 is a cross-sectional view taken along line I-I of FIG. 1, according to an exemplary embodiment of the inventive concept, Referring to FIGS. 1 and 2, a semiconductor device may include a plurality of first lower electrodes 110, a first capacitor insulating film 112, a first upper electrode 113, and a first electrode support 120. The first upper electrode 113 and the first capacitor insulating film 112 are not illustrated in FIG. 1 for clarity.

The plurality of first lower electrodes 110 may be formed on a substrate 100.

The substrate 100 may include bulk silicon or a silicon-on-insulator (SOI). Alternatively, the substrate 100 may include silicon, silicon germanium, silicon germanium on insulator (SGOI), indium antimonide, lead telluride, indium arsenide, indium phosphide, gallium arsenide, and/or gallium antimonide. However, the inventive concept is not limited thereto, The substrate 100 may include, for example, unit devices needed for the formation of the semiconductor device such as various types of active and/or devices. The unit devices may be, for example, cell transistors such as DRAM and flash memories.

The unit devices may be, for example, DRAM memory cell transistors having a $6F^2$ or a $4F^2$ unit cell size. However, the inventive concept is not limited thereto. '1F' as used herein indicates a minimum feature size.

The substrate 100 may include device isolation films to isolate the unit devices.

An interlayer insulating film 103, overlying the unit devices, may be formed on the substrate 100. Within the interlayer insulating film 103, a plurality of storage node contacts 105 may be formed for electrically connecting the unit devices and each of the first lower electrodes 110. Each of the first lower electrodes 110 may be electrically connected with conductive regions included in the unit devices by the storage node contacts 107.

For example, the interlayer insulating film 103 may include silicon oxide, silicon oxynitride and/or silicon nitride. The storage node contact 105 may include, for example, at least one of a semiconductor material doped with an impurity, a conductive silicide compound, a conductive metal nitride, or a metal.

The plurality of first lower electrodes 110 may be formed on the substrate 100. For example, the plurality of first lower electrodes 110 may be formed on the interlayer insulating film 103.

The first lower electrodes 110 may have, for example, a cylinder shape. For example, each of the first lower electrodes 110 may include sidewall portions 110a extending in a thickness direction of the substrate 100, and a bottom portion 110b substantially parallel with an upper surface of the substrate 100. The bottom portion 110b of the first lower electrodes may connect the sidewall portions 110a of the first lower electrodes 110.

The first lower electrodes 110 may be arranged along a first direction DR1 and a second direction DR2. The first direction DR1 and the second direction DR2 may be orthogonal to each other. However, the inventive concept is not limited thereto. The arrangement of the first lower electrodes 110 will be described below.

The first lower electrodes 110 may include, for example, a doped semiconductor material, a conductive metal nitride (e.g., titanium nitride, tantalum nitride and/or tungsten nitride), a metal (e.g., ruthenium, iridium, titanium and/or tantalum), a conductive metal oxide (e.g., iridium oxide), etc. However, the inventive concept is not limited thereto.

The first electrode support 120 may be formed on the interlayer insulating film 103. The first electrode support 120 may have a plate shape extending in a direction that is substantially parallel to the upper surface of the substrate 100.

The first electrode support 120 may be in contact with a sidewall of the first lower electrodes 110. For example, the first electrode support 120 may be in contact with the sidewall portions 110a of the first lower electrodes 110.

The first electrode support 120 may support a plurality of first lower electrodes 110. For example, the first electrode support 120 may prevent the tilting or breaking-off of the first lower electrodes 110. The first lower electrodes 110 may be elongated in a thickness direction of the substrate 100.

An upper surface of the first electrode support 120 may be flush with an uppermost surface of the first lower electrodes 110. For example, the uppermost surface of the sidewall portion 110a of the first lower electrodes 110 may be flush with the upper surface of the first electrode support 120.

The first electrode support 120 may include an insulating material. For example, the first electrode support 120 may include silicon oxynitride (SiON), silicon nitride (SiN), silicon carbonitride (SiCN), silicon oxycarbonitride (SiOCN) and/or silicon boron nitride (SiBN). However, the inventive concept is not limited thereto.

The first capacitor insulating film 112 may be formed on the plurality of first lower electrodes 110 and the first electrode support 120. The first capacitor insulating film 112 may extend along a profile of the first lower electrodes 110, and along an upper surface and a lower surface of the first electrode support 120.

For example, the first capacitor insulating film 112 may include silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate. However, the inventive concept is not limited thereto.

The first upper electrode 113 may be formed on the first capacitor insulating film 112. The first upper electrode 113 may surround an outer sidewall of the first lower electrodes 110. Further, a portion of the first upper electrodes 113 may be interposed between the sidewall portions 110a of the first lower electrodes 110.

The first upper electrode 113 may include, for example, at least one of a doped semiconductor material, a metal, a conductive metal nitride, or a metal silicide.

The first lower electrodes 110, the first capacitor insulating film 112 and the first upper electrode 113 may be included in a first capacitor 115.

The plurality of first lower electrodes 110 may be arranged in the first direction DR1. Neighboring first lower electrodes 110, arranged in the first direction DR1, may be spaced by a first distance D1. In an example, the first distance D1 may not be a distance between centers of adjacent first lower electrodes 110. The first distance D1 may be a shortest distance between the sidewall portions 110a of the first lower electrodes 110 of a pair of adjacent first lower electrodes 110.

In addition to the first direction D1, the first lower electrodes 110 may also be arranged in the second direction DR2. However, in an exemplary embodiment of the inventive concept, the first lower electrodes 110 may not be aligned in a straight line along the second direction DR2. For example, the first lower electrodes 110 may be arranged in a staggered formation.

The first lower electrodes 110 may be aligned in a zigzag shape along a first alignment line L1 in the second direction DR2. For example, a plurality of first lower electrodes 110 may include a first group 110_1 of the first lower electrodes 110, arranged in the first direction DR1, and a second group 110_2 of the first lower electrodes 110, arranged in the first direction DR1. The first group 110_1 of the first lower electrodes 110 and the second group 110_2 of the first lower electrodes 110 may be adjacent to each other in the second direction DR2.

In an example, a first center of each of the first lower electrodes 110 included in the first group 110_1 of the first lower electrodes 110, may not coincide with a second center of a respective the first lower electrodes 110 included in the second group 110_2 of the first lower electrodes 110.

For example, a line, which passes through a center of each of the first lower electrodes 110 included in the first group 110_1 of the first lower electrodes 110 and extends in the second direction DR2, may not pass through a center of each of the first lower electrodes 110 included in the second group 110_2 of the first lower electrodes 110.

Thus, the first lower electrodes 110, as illustrated in FIG. 1, may be arranged in a zigzag shape in the second direction DR2.

Although FIG. 1 illustrates that the group 110_1 (FIG. 1) of the first lower electrodes 110 disposed in the outermost side in the second direction DR2, from among the first lower electrodes 110 aligned in the first direction DR1, the group 110_1 does not include the first lower electrodes 110 positioned on the first alignment line L1, this is illustrated merely for convenience of explanation. Thus, exemplary embodiments of the inventive concept are not limited thereto. In other words, the arrangement of the first lower electrodes 110 in FIG. 1 is merely exemplary.

The plurality of first lower electrodes 110 may be arranged such that a first distance between neighboring first lower electrodes 110 in the first direction DR1 and a second distance between neighboring first lower electrodes 110 in a third directing DR3 are equal to each other. The third direction DR3 may cross the first direction DR1 and the second direction DR2. For example, the first distance D1, measured between first lower electrodes 110 adjacent in the first direction DR1, may be substantially same as a second distance D2, measured between first lower electrodes 110 adjacent in the third direction DR3.

In addition, a distance between neighboring first lower electrodes 110 in a fourth direction DR4 may be substantially equal to the first and second distances Di and D2. The fourth direction DR4 may cross the first direction DR1, the second direction DR2 and the third direction DDr. The first direction DR1 may be perpendicular to the second direction DR2. The third direction DR3 may form an angle having a first magnitude with respect to the second direction DR2.

The fourth direction DR4 may form an angle having the first magnitude with respect to the second direction DR2, as shown in FIG. 1.

Alternatively, a plurality of first lower electrodes 110 may be arranged in a hexagonal structure with an additional first lower electrode 110 disposed at the center of the hexagonal structure.

The first electrode support 120 may have an outer sidewall defining a boundary of the first electrode support 120. The outer sidewall of the first electrode support 120 may include a first sidewall 120sa extending in the first direction DR1, a second sidewall 120sb extending in the second direction DR2, and a connecting sidewall 120sc.

The connecting sidewall 120sc of the first electrode support 120 may connect the first sidewall 120sa of the first electrode support 120 with the second sidewall 120sb of the first electrode support 120.

According to an exemplary embodiment of the inventive concept, the connecting sidewall 120sc may extend in the third direction DR3. In addition, the connecting sidewall 120sc may extend in the fourth direction DR4.

For example, the connecting sidewall 120sc of the first electrode support 120 may be substantially parallel with a third group 110_3 of the first lower electrodes 110, which are arranged in the third direction DR3. Alternatively, or additionally, the connecting sidewall 120sc of the first electrode support 120 may be parallel with a group of the first lower electrodes 110, which are arranged in the fourth direction DR4.

Between the first sidewall 120sa of the first electrode support 120 and the second sidewall 120sb of the first electrode support 120, the connecting sidewall 120sc of the first electrode support 120, extending in the third direction DR3, and the connecting sidewall 120sc of the first electrode support 120, extending in the fourth direction DR4, may be alternately positioned.

The connecting sidewall 120sc may overlap a portion of the first lower electrodes 110 that are in contact with the first electrode support 120 in the first direction DR1. The connecting sidewall 120sc of the first electrode support 120 may overlap a portion of the first lower electrodes 110 that are in contact with the first electrode support 120 in the second direction DR2.

For example, at least one group of the first lower electrodes 110, which are arranged in the first direction DR1, may be disposed between the connecting sidewall 120sc of the first electrode support 120 extending in the third direction DR3 and the connecting sidewall 120sc of the first electrode support 120 extending in the fourth direction DR4.

Alternatively, or additionally, a portion of the group of the first lower electrodes 110, which are arranged in the second direction DR2, may be disposed between the connecting sidewall 120sc of the first electrode support 120 extending in the third direction DR3 and the connecting sidewall 120sc of the first electrode support 120 extending in the fourth direction DR4.

An outer sidewall of the first electrode support 120 may define a boundary of an upper surface of the first electrode support 120.

For example, the first electrode support 120 may include a first boundary side 120ba defined by the first sidewall 120sa, a second boundary side 120bb defined by the second sidewall 120sb, and connecting boundary side 120bc defined by the connecting sidewall 120sc. The connecting boundary side 120bc of the first electrode support 120 may connect the first boundary side 120ba of the first electrode support 120 with the second boundary side 120bb of the first electrode support 120.

In other words, a boundary of an upper surface of the first electrode support 120 may include the first boundary side 120ba, the second boundary side 120bb, and the connecting boundary side 120bc.

The connecting boundary side 120bc of the first electrode support 120 may be a side extending in the third direction DR3. Alternatively, or additionally, the connecting boundary side 120bc of the first electrode support 120 may be a side extending in the fourth direction DR4, A distance between the connecting boundary side 120bc and the first lower electrodes 110 most adjacent to the connecting boundary side 120bc may be a third distance D3. The third distance D3 may be substantially equal to, greater than, or less than a distance (D1 or D2) between the adjacent first lower electrodes 110.

The first electrode support 120 may include a first through pattern 125 penetrating the first electrode support 120, in other words, the first through pattern 125 may be a hole or an opening of the first electrode support 120. The first electrode support 120 may include a first inner support region 121, formed with the first through pattern 125, and a first outer support region 122, not formed with the first through pattern 125.

The first outer support region 122 may be disposed along a periphery of the first inner support region 121. Accordingly, a boundary of the first electrode support 120 may be defined by the first outer support region 122.

The first outer support region 122 may include an outer sidewall of the first electrode support 120. The first outer support region 122 may include the first sidewall 120sa of the first electrode support 120, the second sidewall 120sb of the first electrode support 120, and the connecting sidewall 120sc of the first electrode support 120.

A portion of the first lower electrodes 110 may be in contact with the first inner support region 121, and the rest of the first lower electrodes 110 may be in contact with the first outer support region 122.

For example, among a plurality of the first lower electrodes 110 arranged in a row in the first direction DR1, at least two first lower electrodes 110 disposed on the opposite ends of the row may be in contact with the first outer support region 122.

Further, among a plurality of the first lower electrodes 110 arranged in a column in the second direction DR2, at least two first lower electrodes 110 disposed on the opposite ends of the column may be in contact with the first outer support region 122.

The first through pattern 125 may be formed between the adjacent first lower electrodes 110. During fabrication, the first through pattern 125 may be formed to remove a mold insulating film that is used in forming the first lower electrodes 110.

As illustrated in FIG. 1, the first through pattern 125 may be formed between three adjacent first lower electrodes 110, although exemplary embodiments of the inventive concept are not bruited hereto. For example, the first through pattern 125 may be formed between four or more first lower electrodes 110.

However, the first lower electrodes 110, being in contact with the first inner support region 121, may not face two or more of the first through patterns 125.

A portion of the first outer support region 122, which does not overlap the first inner support region 121 in the first direction DR1 and does not overlap the first inner support region 121 in the second direction DR2, may include a portion having a width D4 (see FIG. 1). The width D4 may be measured in the second direction DR2. The width D4 may decrease in a direction away from the first inner support region 121.

In addition, portion of the first outer support region 122, which does not overlap the first inner support region 121 in the first direction DR1 and does not overlap the first inner support region 121 in the second direction DR2, may include a portion having a width D5 (see FIG. 1), The width D5 may be measured in the first direction DR1. The width D5 may decrease in a direction away from the first inner support region 121.

For example, the connecting sidewall 120sc of the first electrode support may be a sidewall extending in the third direction DR3 or the fourth direction DR4. Accordingly, at an increasing distance from the first inner support region 121, a distance between the connecting sidewall 120sc of the first electrode support extending in the third direction DR3 and the connecting sidewall 120sc of the first electrode support extending in the fourth direction DR4 may decrease.

In other words, on an upper surface of the first electrode support 120, a distance between the connecting boundary side 120bc of the first electrode support 120 may decrease with an increasing distance from the first inner support region 121.

The connecting sidewall 120sc of the first electrode support, extending in the third direction DR3 or the fourth direction DR4, may be formed between the first sidewall 120sa of the first electrode support and the second sidewall 120sb of the first electrode support. Thus, the connecting sidewall 120sc may disperse stress from concentrating on an edge of the first electrode support 120.

As the stress concentration on the edge of the first electrode support 120 is reduced, the probability that a crack may occurs in the first electrode support 120 is reduced or is zero. Accordingly, the semiconductor device can have increased reliability and increased operating performance.

Figure 3:
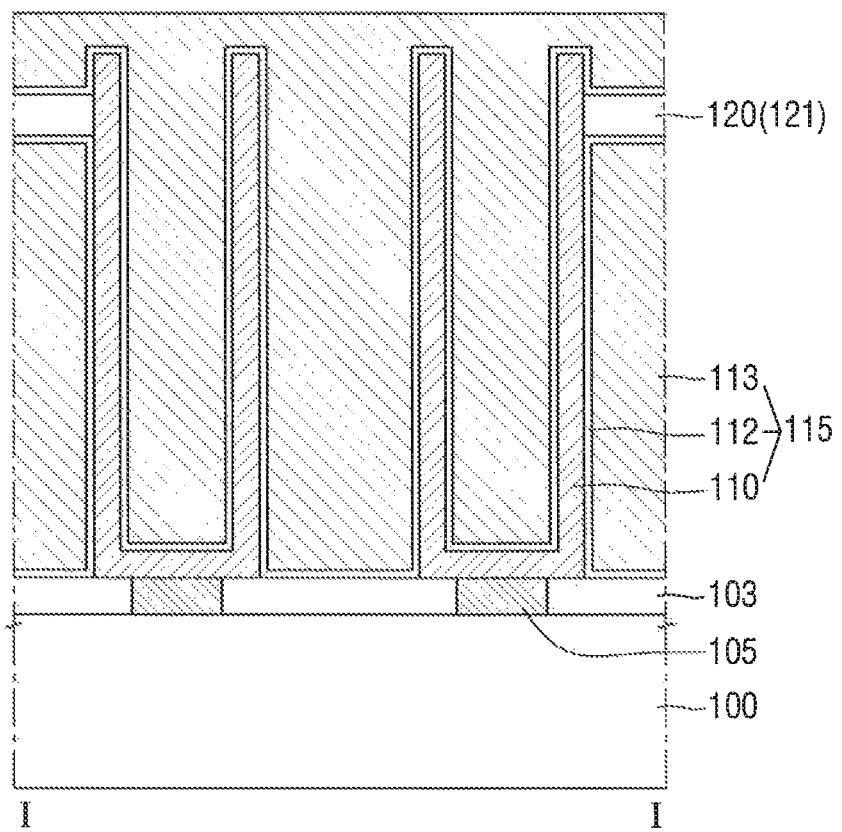
FIG. 3 is a cross-sectional view illustrating a semiconductor device according to an exemplary embodiment of the inventive concept.
Figure 4:
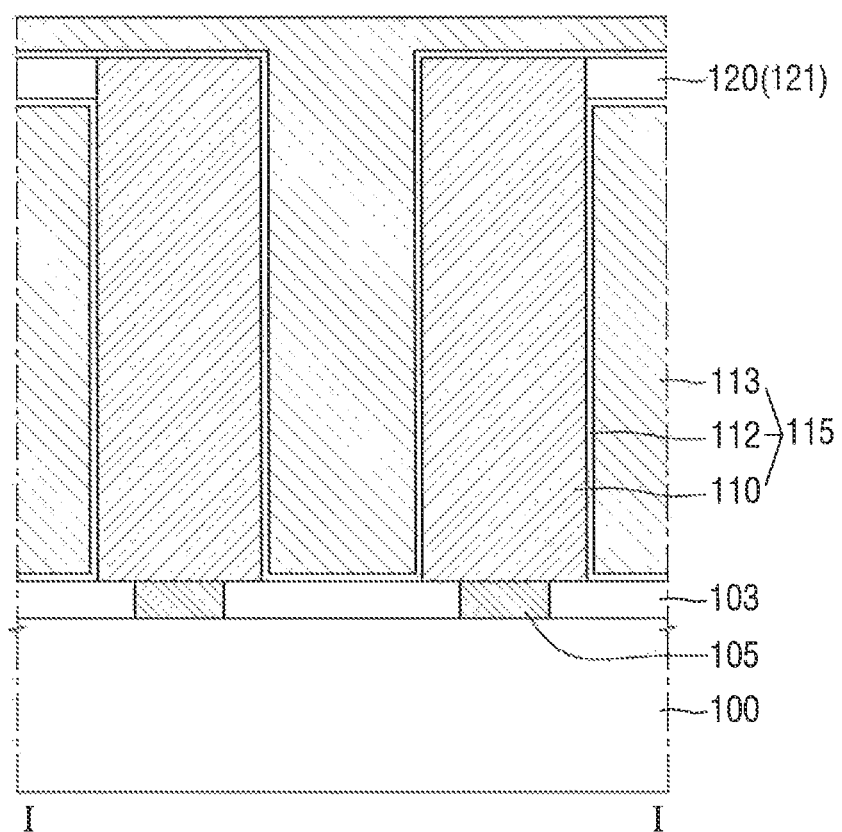
FIG. 4 is a cross-sectional view illustrating a semiconductor device according to an exemplary embodiment of the inventive concept.

FIG. 3 is a crass-sectional view illustrating a semiconductor device according to an exemplary embodiment of the inventive concept. FIG. 4 is a cross-sectional view illustrating a semiconductor device according to an exemplary embodiment of the inventive concept. For convenience of explanation, differences between FIGS. 3 and 4 and FIGS. 1 and 2 may be described below.

FIGS. 3 and 4 are cross-sectional views taken along line I-I of FIG. 1.

Referring to FIG. 3, in a semiconductor device, a portion of the first lower electrodes 110 may be protruding upward to an elevation that is higher than an elevation of an upper surface of the first electrode support 120.

A height (or elevation) from the interlayer insulating film 103 to an uppermost surface of to the first lower electrodes 110 may be greater than a height from the interlayer insulating film 103 to an upper surface of the first electrode support 120.

Referring to FIG. 4, in a semiconductor device, the first lower electrodes 110 may be bar-like shaped pillars that are elongated in the thickness direction of the substrate 100.

The first capacitor insulating film 112 may be formed along an outer sidewall of the first lower electrodes 110. The first upper electrode 113 may surround the outer sidewall of the first lower electrodes 110, but may not be included within (or inside of) the first lower electrodes 110 since the first lower electrodes 110 are solid (e.g., not hollow) pillars.

Figure 5:
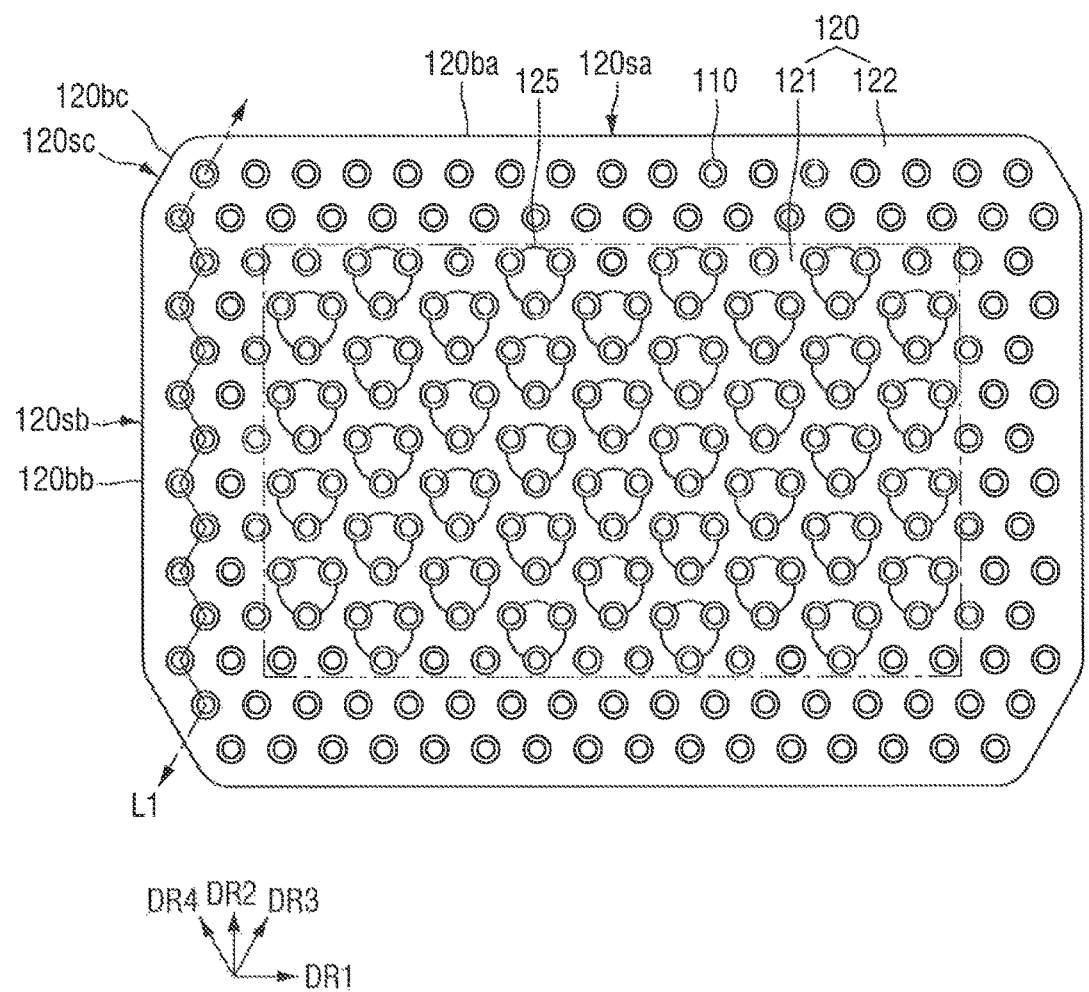
FIG. 5 is a plan view illustrating a lower electrode and an electrode support of a semiconductor device according to an exemplary embodiment of the inventive concept.
Figure 6:
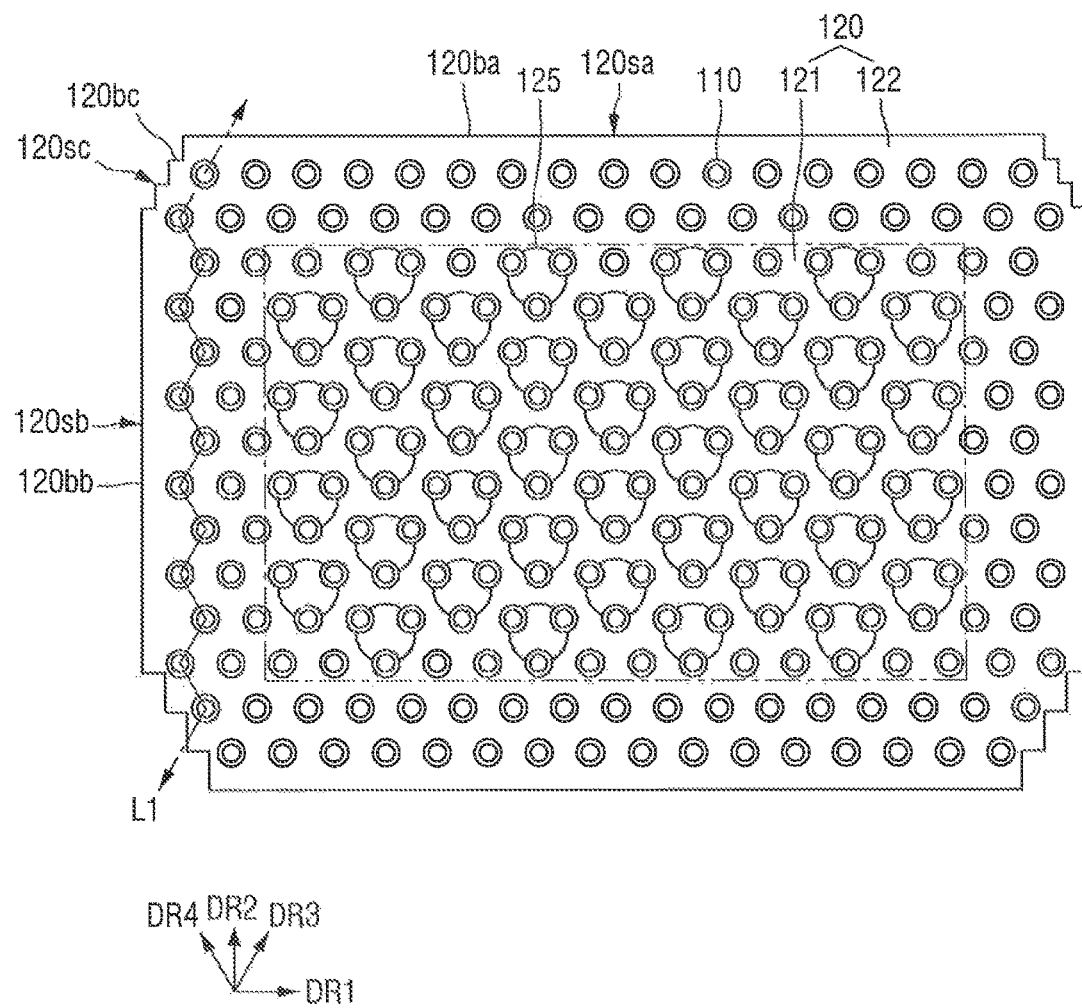
FIG. 6 is a plan view illustrating a lower electrode and an electrode support of a semiconductor device according to an exemplary embodiment of the inventive concept.
Figure 7:
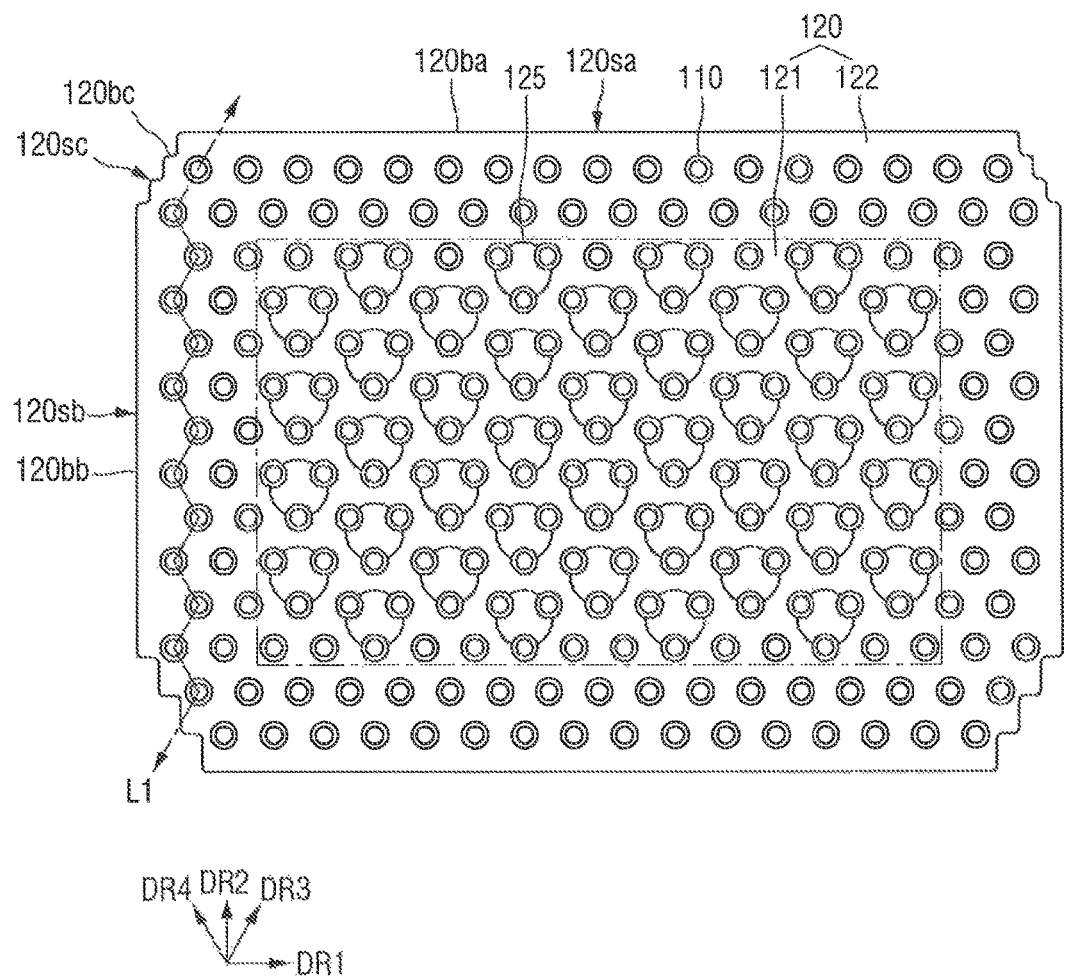
FIG. 7 is a plan view illustrating a lower electrode and an electrode support of a semiconductor device according to an exemplary embodiment of the inventive concept.
Figure 8:
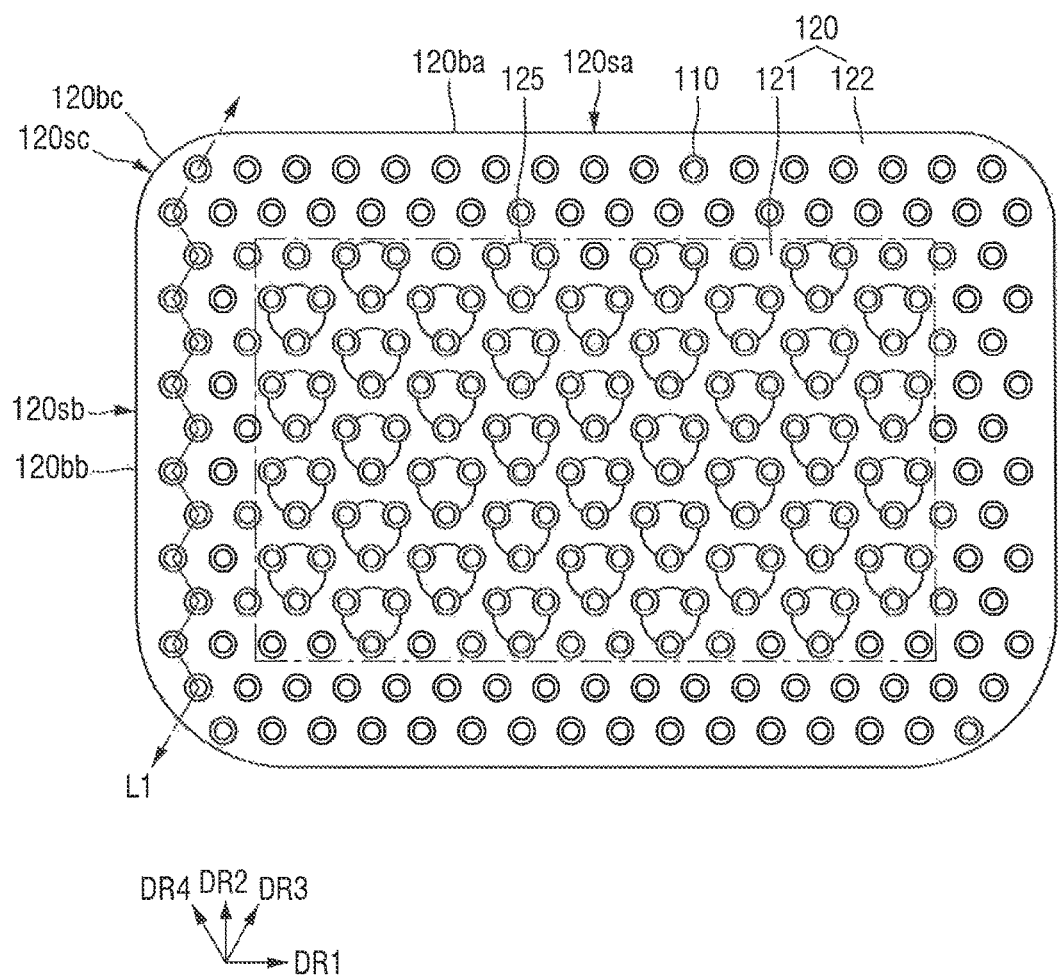
FIG. 8 is a plan view illustrating a lower electrode and an electrode support of a semiconductor device according to an exemplary embodiment of the inventive concept.

FIG. 5 is a plan view illustrating a lower electrode and an electrode support of a semiconductor device according to an exemplary embodiment of the inventive concept. FIG. 6 is a plan view illustrating a lower electrode and an electrode support of a semiconductor device according to an exemplary embodiment of the inventive concept. FIG. 7 is a plan view illustrating a lower electrode and an electrode support of a semiconductor device according to an exemplary embodiment of the inventive concept. FIG. 8 is a plan view illustrating a lower electrode and an electrode support of a semiconductor device according to an exemplary embodiment of the inventive concept. For convenience of explanation, differences between FIGS. 5 to 8 and FIGS. 1 and 2 may be described below.

The first upper electrode 113 and the first capacitor insulating film 112 are not illustrated in FIGS. 5-8 for clarity.

Referring to FIG. 5, in a semiconductor device, a connecting part between the first sidewall 120sa of the first electrode support 120 and the connecting sidewall 120sc of the first electrode support 120 may be rounded. In other words, the corner where the first sidewall 120sa and the connecting sidewall 120sc meet may be rounded.

A connecting part between the second sidewall 120sb of the first electrode support 120 and the connecting sidewall 120sc of the first electrode support 120 may be rounded. In other words, the corner where the second sidewall 120sb and the connecting sidewall 120sc, meet may be rounded.

On a boundary of the upper surface of the first electrode support 120, a connecting part between the first boundary side 120ha of the first electrode support 120 and the connecting boundary side 120bc of the first electrode support 120 may be rounded. Further, a connecting part between the second boundary side 120bb of the first electrode support 120 and the connecting boundary side 120bc of the first electrode support 120 may be rounded.

Referring to FIG. 6, in a semiconductor device, the connecting sidewall 120sc of the first electrode support 120 may include a portion having a zigzag shape.

The connecting sidewall 120sc, including a portion having a zigzag shape, may be connected with the first sidewall 120sa of the first electrode support 120 and the second sidewall 120sb of the first electrode support 120.

On a boundary of the upper surface of the first electrode support 120, the connecting boundary side 120bc of the first electrode support 120 may include a portion having a zigzag shape. For example, a boundary of the upper surface of the first electrode support 120, defined by the connecting sidewall 120sc of the first electrode support 120, may include a portion having a zigzag shape.

Alternatively, on a boundary of the upper surface of the first electrode support 120, the connecting boundary side 120bc of the first electrode support may have a staircase shape.

When the connecting sidewall 120sc of the first electrode support 120 includes a portion having a zigzag shape, the first outer support region 122, which includes the connecting sidewall 120sc, may include a portion in which a width in the first direction DR1 and a width in the second direction DR2 decreases in a direction away from the first inner support region 121. For example, see FIG. 4, widths D4 and D5.

A distance between the connecting sidewall 120sc of the first electrode support 120 and the first lower electrodes 110 most adjacent to the connecting sidewall 120sc of the first electrode support 120 may be less than, substantially equal to, or greater than a distance D1 between the adjacent first lower electrodes 110, as shown in FIG. 1.

Referring to FIG. 7, in a semiconductor device, the connecting sidewall 120sc of the first electrode support 120 may include a portion having a wavy shape, or a zigzag shape with rounded corners.

The connecting sidewall 120sc, having the wavy shape or the zigzag shape with rounded corners, may be connected with the first sidewall 120sa of the first electrode support 120 and the second sidewall 120sb of the first electrode support 120.

On a boundary of the upper surface of the first electrode support 120, the connecting boundary side 120bc of the first electrode support 120 may include a portion having a wavy shape or a zigzag shape with rounded corners. For example, a boundary of the upper surface of the first electrode support 120, defined by the connecting sidewall 120sc of the first electrode support 120, may include a portion having a wavy shape or a zigzag shape with rounded corners.

A distance between the connecting sidewall 120sc of the first electrode support 120 and the first lower electrodes 110 most adjacent to the connecting sidewall 120sc of the first electrode support 120 may be less than, substantially equal to, or greater than a distance D1 between the adjacent first lower electrodes 110, as shown in FIG. 1.

Referring to FIG. 8, in a semiconductor device, the connecting sidewall 120sc of the first electrode support 120 may include a portion having a rounded/curved shape.

The connecting sidewall 120sc, including a portion having a rounded/curved, may be connected with the first sidewall 120sa of the first electrode support 120 and the second sidewall 120sb of the first electrode support 120.

The connecting boundary side 120bc of the first electrode support 120 may include a portion having a rounded/curved shape.

Figure 9:
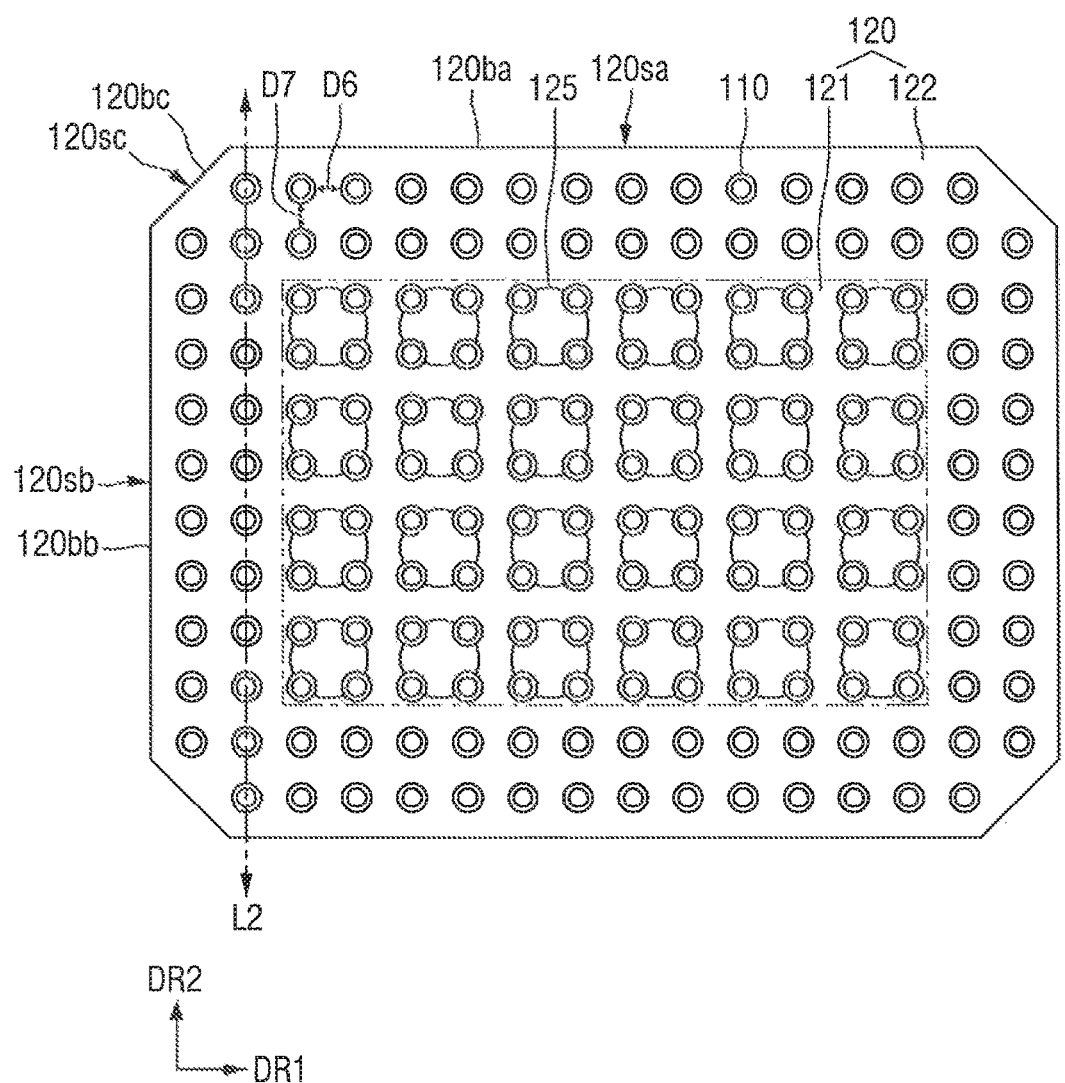
FIG. 9 is a plan view illustrating a lower electrode and an electrode support of a semiconductor device according to an exemplary embodiment of the inventive concept.

FIG. 9 is a plan view illustrating a lower electrode and an electrode support of a semiconductor device according to an exemplary embodiment of the inventive concept. For convenience of explanation, differences between FIG. 9 and FIGS. 1 and 2 may be described below.

The first upper electrode 113 and the first capacitor insulating film 112 are not illustrated in FIG. 9 for clarity.

Referring to FIG. 9, in a semiconductor device, the first lower electrodes 110 may be arranged in a matrix form, for example, in a formation that is not staggered. For example, first lower electrodes 110 of adjacent rows of first lower electrodes 110 may be arranged along the second direction DR2.

For example, the first lower electrodes 110 arranged in the second direction DR2 may be arranged along a second alignment line L2, parallel with the second direction DR2. In addition, the first lower electrodes 11.0 may be arranged in the first direction DR1.

Adjacent first lower electrodes 110, aligned in the first direction DR1, may be spaced apart from each other by a fifth distance D5. Adjacent first lower electrodes 110, aligned in the second direction DR2, may be spaced apart from each other by a sixth distance D6. For example, the fifth distance 105 and the sixth distance D6 may be equal to each other. However, the inventive concept is not limited thereto.

As illustrated in FIG. 9, the first through pattern 125 may be formed between four adjacent first lower electrodes 110, although the inventive concept is not limited hereto.

Figure 10:
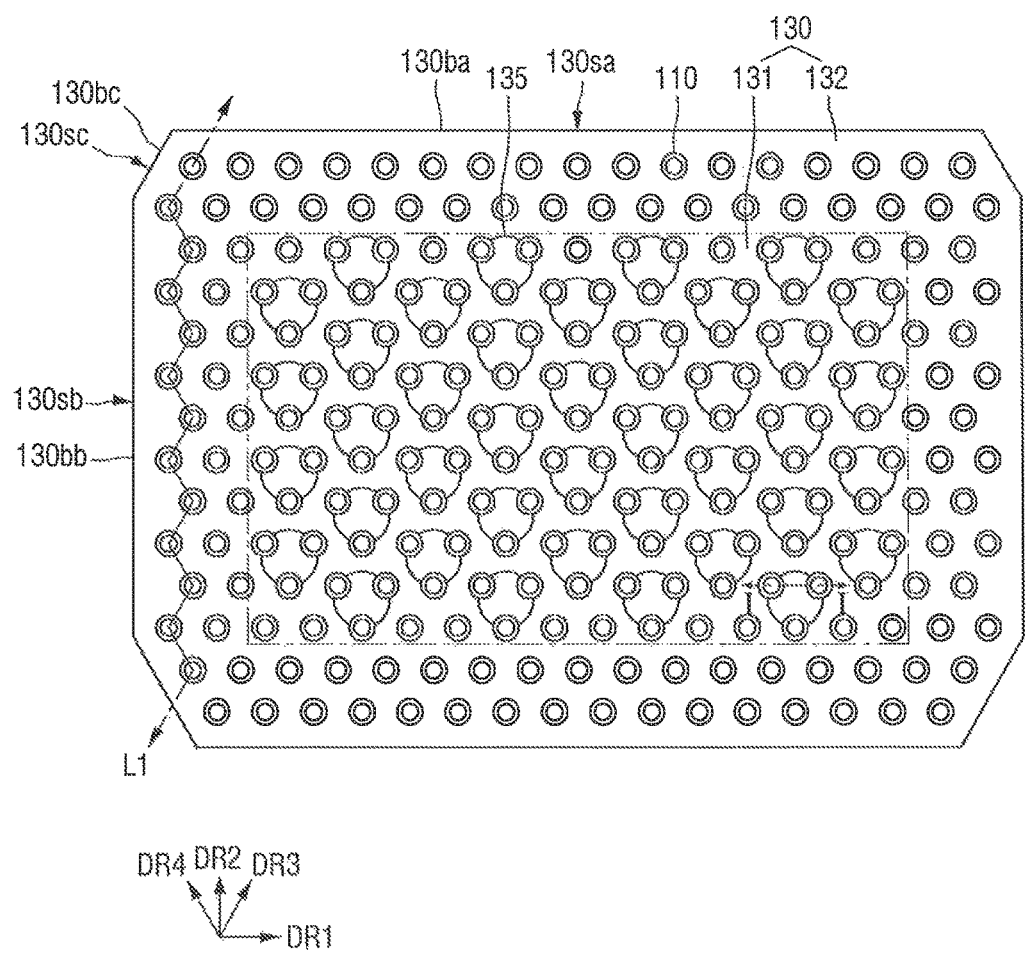
FIG. 10 is a plan view illustrating a lower electrode and an electrode support of a semiconductor device according to an exemplary embodiment of the inventive concept.
Figure 11:
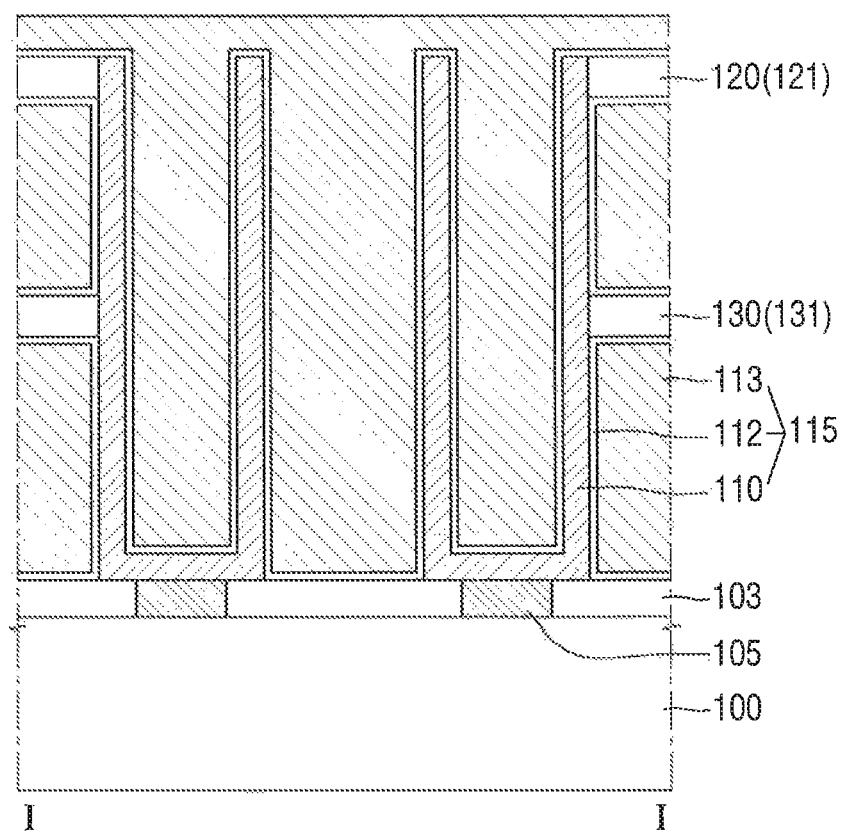
FIG. 11 is a cross-sectional view taken along line I-I of FIG. 10, according to an exemplary embodiment of the inventive concept.

FIG. 10 is a plan view illustrating a lower electrode and an electrode support of a semiconductor device according to an exemplary embodiment of the inventive concept. FIG. 11 is a cross-sectional view taken along line I-I of FIG. 10, according to an exemplary embodiment of the inventive concept. For convenience of explanation, differences between FIGS. 10 and 11 and FIGS. 1 and 2 may be described below.

FIG. 10 may not illustrate the first capacitor insulating film 112, the first upper electrode 113 and the first electrode support 120 for clarity.

Referring to FIGS. 10 and 11, a semiconductor device may include a second electrode support 130 in addition to the first electrode support 120.

The second electrode support 130 may be disposed between the first electrode support 120 and the substrate 100. The second electrode support 130 may be disposed on the interlayer insulating film 103.

The second electrode support 130 may have a plate shape extending in a direction substantially parallel with the upper surface of the substrate 100. The second electrode support 130 may be in contact with a sidewall of the first lower electrodes 110. The second electrode support 130 may support the plurality of first lower electrodes 110.

The first electrode support 120 may be an upper support of the first lower electrodes 110, and the second electrode support 130 may be a lower support of the first lower electrodes 110.

The second electrode support 130 may include an outer sidewall defining a boundary of the second electrode support 130. For example, an outer sidewall of the second electrode support 130 may have a shape corresponding to an outer sidewall of the first electrode support 120.

In other words, a boundary of an upper surface of the second electrode support 130 may have a substantially identical shape and/or size as the boundary of the upper surface of the first electrode support 120. For example, the upper surface of the second electrode support 130 may have the shape and/or size of the upper surface of the first electrode support 120, projected in the thickness direction of the substrate 100. For example, the first and second electrode supports 120 and 130 may have substantially the same planar shape and/or size, but not necessarily the same thickness.

However, because the second electrode support 130 may be formed through an etch process, a width of the second electrode support 130 in the first direction DR1 may be different from a corresponding width of the first electrode support 120 in the first direction DR1. In addition, a width of the second electrode support 130 in the second direction DR2 may be different from a corresponding width of the first electrode support 120 in the second direction DR2.

The second electrode support 130 may include a second through pattern 135 penetrating the second electrode support 130. In other words, the second through pattern 135 may be a hole or an opening of the second electrode support 130. The second through pattern 135 may be formed at a position corresponding to the first through pattern 125. For example, the first and second through patterns 125 and 135 may overlap each other.

An outer sidewall of the second electrode support 130 may include a first sidewall 130sa extending in the first direction DR1, a second sidewall 130sb extending in the second direction DR2, and a connecting sidewall 130sc.

The connecting sidewall. 130sc of the second electrode support 130 may connect the first sidewall 130sa of the second electrode support 130 with the second sidewall 130sb of the second electrode support 130. The connecting sidewall 130sc of the second electrode support 130 may be a sidewall extending in the third direction DR3. Alternatively, or additionally, the connecting sidewall 1.30sc of the second electrode support 130 may be a sidewall extending in the fourth direction DR4.

The connecting sidewall 130sc of the second electrode support 130 may overlap a portion of the first lower electrodes 110 that is in contact with the second electrode support 130, in the first direction DR1. The connecting sidewall 130sc of the second electrode support may overlap a portion of the first lower electrodes 110 that is in contact with the second electrode support 130, in the second direction DR2.

For example, at least one or more first lower electrodes 110, the one or more first lower electrodes 110 being arranged in the first direction DR1, may be disposed between the connecting sidewall 130sc, which extends in the third direction DR3, and the connecting sidewall 130sc, which extends in the fourth direction DR4.

Alternatively, or additionally, at least one or more first lower electrodes 110, the one or more first lower electrodes 110 being arranged in the second direction DR2, may be disposed. between the connecting sidewall 130sc, which extends in the third direction DR3, and the connecting sidewall 130sc, which extends in the fourth direction DR4.

The second electrode support 130 may include a first boundary side 130ba, defined by the first sidewall 130sa of the second electrode support 130, a second boundary side 130bb, defined by the second side gall 130sb of the second electrode support 130, and a connecting boundary side 130bc, defined by the connecting sidewall 130sc of the second electrode support 130.

The second electrode support 130 may include a second inner support region 131, which includes the second through pattern(s) 135, and a second outer support region 132, which does not include the second through pattern(s) 135.

The second outer support region 132 may be disposed along a periphery of the second inner support region 131. Accordingly, a boundary of the second electrode support 130 may be defined by the second outer support region 132.

The second outer support region 132 may include the first sidewall 130sa of the second electrode support 130, the second sidewall 130sb of the second electrode support 130, and the connecting sidewall 130sc of the second electrode support 130.

For example, among a plurality of the first lower electrodes 110 arranged in a row in the first direction DR1, at least two first lower electrodes 110 disposed on the opposite ends of the row may be in contact with the second outer support region 132.

Further, among a plurality of the first lower electrodes 110 arranged in a column in the second direction DR2, at least two first lower electrodes 110 disposed on the opposite ends of the column may be in contact with the second outer support region 132.

A portion of the second outer support region 132, which does not overlap the second inner support region 131 in the first direction DR1 and does not overlap the second inner support region 131 in the second direction DR2, may include a portion having a first width. The first width may be measured in the second direction DR2. The first width may decrease in a direction away from the second inner support region 131.

Further, the portion of the second outer support region 132, which does not overlap the second inner support region 131 in the first direction DR1 and does not overlap the second inner support region 131 in the second direction DR2, may include a portion having a second width. The second width may be measured in the first direction DR1. The second width may decrease in a direction away from the second inner support region 131.

Figure 12:
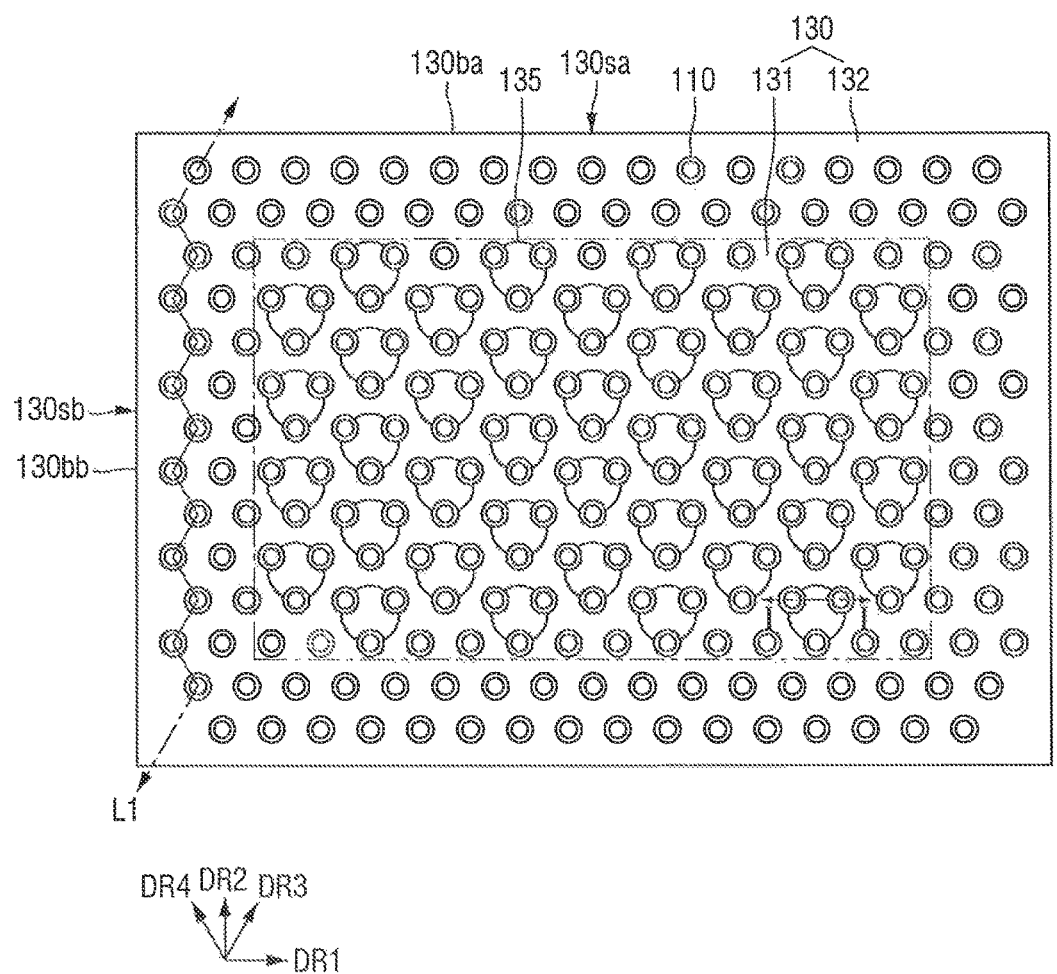
FIG. 12 is a plan view illustrating a lower electrode and an electrode support of a semiconductor device according to an exemplary embodiment of the inventive concept.
Figure 13:
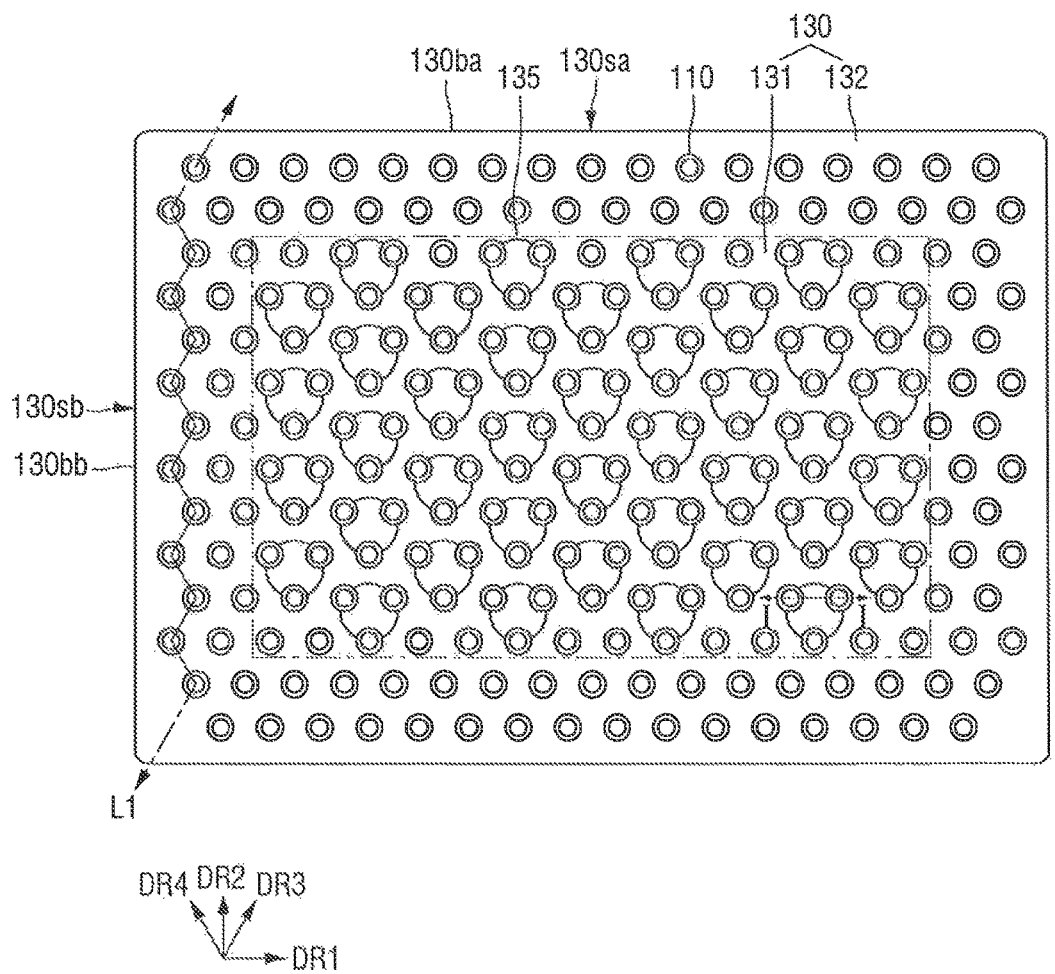
FIG. 13 is a plan view illustrating a lower electrode and an electrode support of a semiconductor device according to an exemplary embodiment of the inventive concept.

FIG. 12 is a plan view illustrating a lower electrode and an electrode support of a. semiconductor device according to an exemplary embodiment of the inventive concept. FIG. 13 is a plan view illustrating a lower electrode and an electrode support of a semiconductor device according to an exemplary embodiment of the inventive concept. For convenience of explanation, differences between FIGS. 12 and 13 and FIGS. 10 and 11 may be described below.

FIGS. 12 to 13 may not illustrate the first capacitor insulating film 112 and the first upper electrode 113 for clarity.

Referring to FIGS. 12 and 13, in a semiconductor device, according to exemplary embodiments of the inventive concept, the second electrode support 130 may not include the connecting sidewall for connecting the first sidewall 130sa with the second sidewall 130sb.

For example, the first sidewall 130sa of the second electrode support 130 may meet the second sidewall 130sb of the second electrode support 130 to form a corner of the second electrode support 130, as shown in FIG. 12.

Accordingly, an outer sidewall of the second electrode support 130 may not have a shape corresponding to the outer sidewall of the first electrode support 120.

In FIG. 12, the edge of the second electrode support 130, which is formed as a result of the first sidewall 130sa of the second electrode support 130, may meet the second sidewall 130sb of the second electrode support 130 to form a corner or angular area.

In FIG. 13, the edge of the second electrode support 130, which is formed as a result of the first sidewall 130sa meeting the second sidewall 130sb, may be rounded/curved.

A first lower electrode 110 might not be disposed in an edge of the second electrode support 130, between a pair of rounded/curved portions of the second electrode support 130 which face each other in the first direction DR1, because a width of the pair of rounded/curved portions in the second direction DR2 may be smaller than a width of the first lower electrodes 110 in the second direction DR2.

In addition, a first lower electrode 110 might not be disposed in an edge of the second electrode support 130, between a pair of rounded/curved portions of the second electrode support 130 which face each other in the second direction DR2, because a width of the pair of rounded/curved portions in the first direction DR1 may be smaller than a width of the first lower electrodes 110 in the first direction DR1. In other words, the width of the rounded/curved portions of the second electrode support 130 may be smaller than the width of a first lower electrode 110.

In FIGS. 12 and 13, a boundary of the structure of the first electrode support 120 may be adjusted to prevent/reduce stress concentration, but a boundary of the structure of the second electrode support 130 may not be adjusted to prevent/reduce stress concentration.

Figure 14:
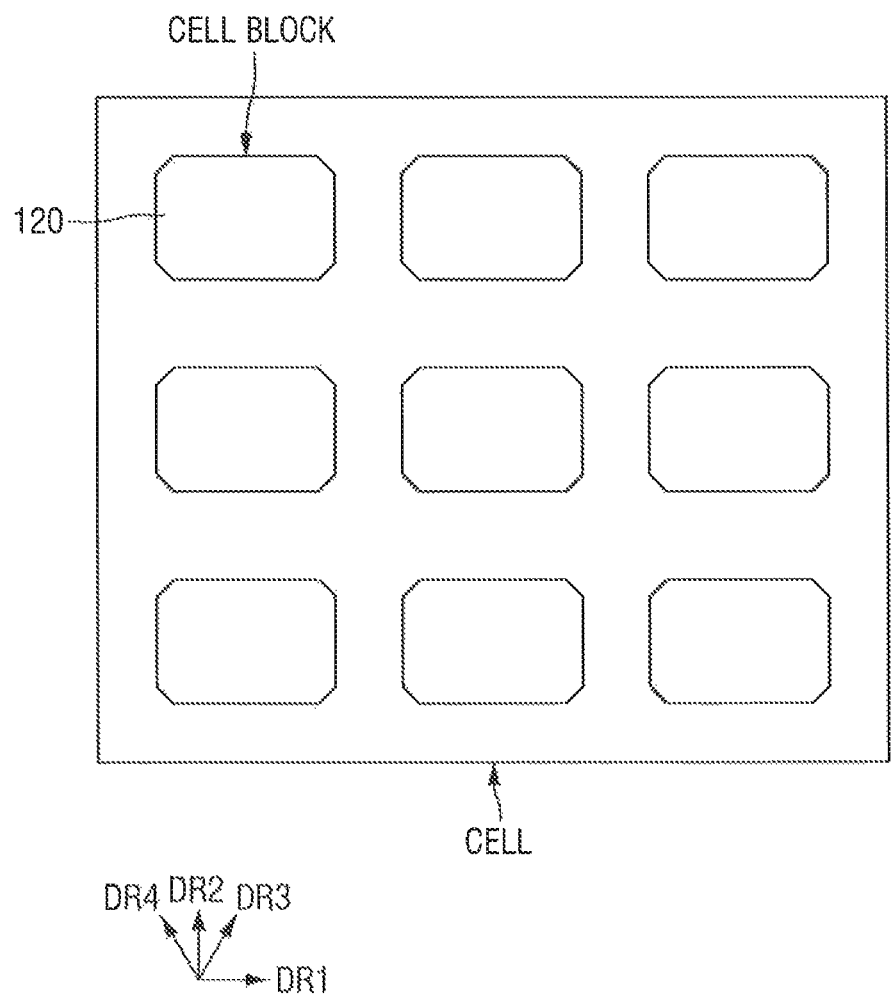
FIG. 14 is a plan view illustrating a semiconductor device according to an exemplary embodiment of the inventive concept.

FIG. 14 is a plan view illustrating a semiconductor device according to an exemplary embodiment of the inventive concept.

FIG. 14 may not illustrate the first capacitor insulating film 112, the first upper electrode 113 and the first lower electrodes 110 for clarity.

Referring to FIGS. 1, 2 and 14, a semiconductor device may include a cell region CELL. The cell region CELL may be a region of a substrate 100. The cell region CELL may include at least one cell block CELL BLOCK.

Each cell block CELL BLOCK may include a plurality of first lower electrodes 110 and the first electrode support 120, which are formed on the substrate 100 of each cell block CELL BLOCK.

Each cell block CELL BLOCK may be defined by the first electrode support 120.

FIG. 14 illustrates that each cell block CELL BLOCK includes the first electrode support 120, described with reference to FIG. 1. However, the inventive concept is not limited thereto.

For example, each cell block CELL BLOCK may also include one of the structures explained with reference to FIGS. 1 to 13.

Figure 15:
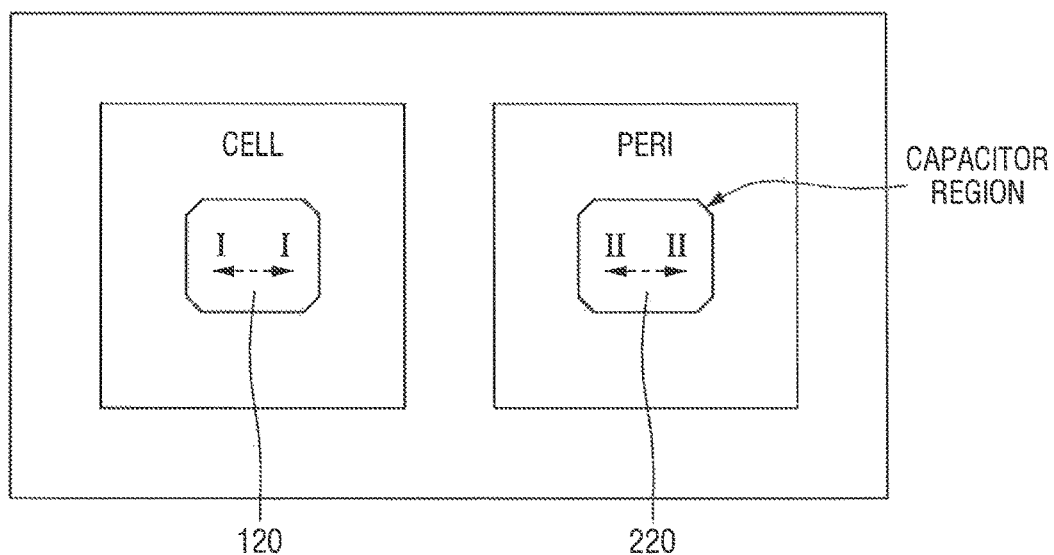
FIG. 15 is a plan view illustrating a semiconductor device according to an exemplary embodiment of the inventive concept.
Figure 16:
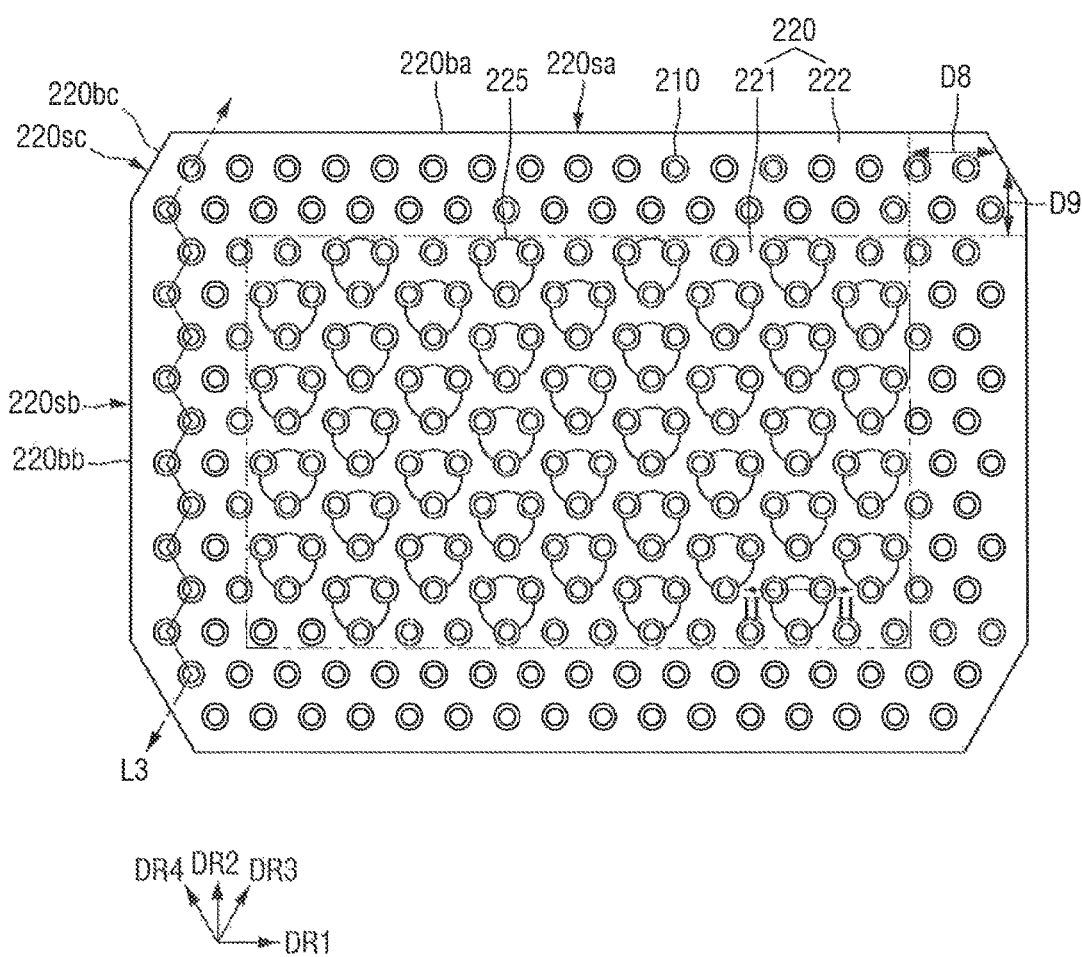
FIG. 16 is a plan view illustrating an electrode support and a lower electrode included in a peripheral region of the semiconductor device of FIG. 15, according to an exemplary embodiment of the inventive concept.
Figure 17:
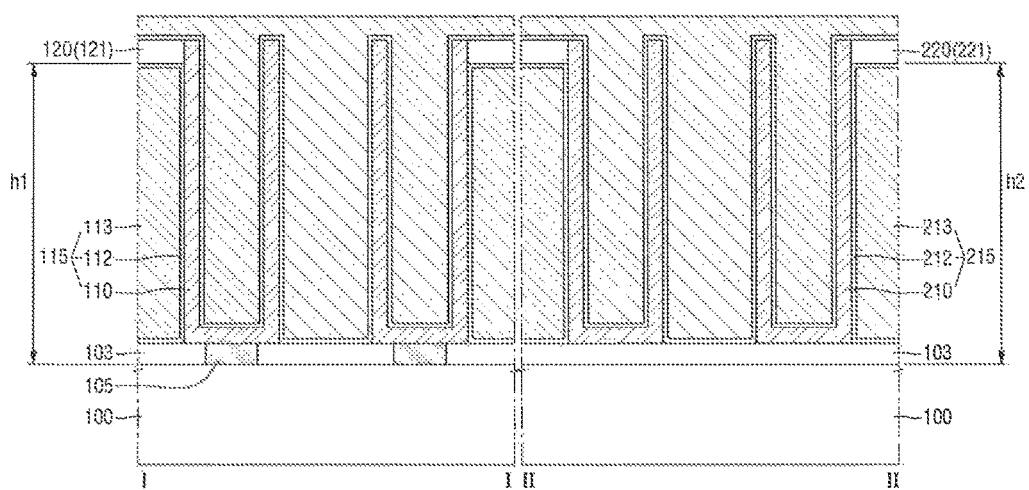
FIG. 17 is a cross-sectional view taken along line II-II of FIG. 15, according to an exemplary embodiment of the inventive concept.

FIG. 15 is a plan view illustrating a semiconductor device according to an exemplary embodiment of the inventive concept. FIG. 16 is a plan view illustrating an electrode support and a lower electrode included in a peripheral region of the semiconductor device of 15, according to an exemplary embodiment of the inventive concept. FIG. 17 is a cross-sectional view taken along line II-II of FIG. 15, according to an exemplary embodiment of the inventive concept.

The first electrode support 120 may be formed in the cell region CELL of FIG. 15. The semiconductor device of FIG. 15 may include a third electrode support 220 and a second lower electrode 210 in a peripheral region PERI.

Referring to FIGS. 15 and 17, a semiconductor device may include a plurality of second lower electrodes 210, a second capacitor insulating film 212, a second upper electrode 213, and a third electrode support 220.

The substrate 100 may include the cell region CELL and the peripheral region PERI. The peripheral region PERI may include a circuit pattern for controlling operations of the cell region CELL.

The plurality of second lower electrodes 210, the second capacitor insulating film 212, the second upper electrode 213 and the third electrode support 220 may be formed in the peripheral region PERI. For example, the second capacitor insulating film 212, the second upper electrode 213, and the third electrode support 220 may be disposed in a capacitor region CAPACITOR REGION of the peripheral region PERI.

A plurality of second lower electrodes 210 may be formed on the substrate 100. For example, a plurality of second lower electrodes 210 may be formed on the interlayer insulating film 103. The second lower electrodes 210 may have a substantially same shape as the first lower electrodes 110.

The third electrode support 220 may be formed on the interlayer insulating film 103. The third electrode support 220 may have a plate shape extending in a parallel direction with the upper surface of the substrate 100. The third electrode support 220 may be in contact with the sidewall of the second lower electrodes 210. The third electrode support 220 may support a plurality of second lower electrodes 210.

The second capacitor insulating film 212 may be formed on a plurality of second lower electrodes 210 and the third electrode support 220. The second upper electrode 213 may be formed on the second capacitor insulating film 212. The second lower electrodes 210, the second capacitor insulating film 212, and the second upper electrode 213 may be included in a second capacitor 215.

Because the second capacitor 215 is fabricated simultaneously with the first capacitor 115, a structure of the second capacitor 215 may be substantially same as a structure of the first capacitor 115.

Further, because the third electrode support 220 may be fabricated simultaneously with the first electrode support 120, a distance h1 from the substrate 100 to the first electrode support 120 may be substantially same as a distance h2 from the substrate 100 to the third electrode support 220.

A plurality of second lower electrodes 210 may be arranged in the first direction DR1 and the second direction DR2 in a matrix form, in a staggered formation, etc.

For example, the second lower electrodes 210 may be arranged in a zigzag shape along a third alignment line L3 (staggered formation).

For example, the plurality of second lower electrodes 210 may be arranged in the first direction DR1 and the third direction DR3 (staggered formation). Alternatively, the plurality of second lower electrodes 210 may be arranged in the first direction DR1 and the fourth direction DR4 (matrix form).

It is described herein that the form and/or shape in which a plurality of second lower electrodes 210 is aligned is same as that of the plurality of first lower electrodes 110, but the inventive concept is not limited hereto. For example, the form and/or shape in which the plurality of second lower electrodes 210 is aligned may be different from that of the plurality of first lower electrodes 110.

The third electrode support 220 may include an outer sidewall defining a boundary of the third electrode support 220. The outer sidewall of the third electrode support 220 may include a first sidewall 220sa extending in the first direction DR1, a second sidewall 220sb extending in a second direction DR2, and a connecting sidewall 220sc.

The connecting sidewall 220sc may connect the first sidewall 220sa with the second sidewall 220sb. The connecting sidewall 220sc may be a sidewall extending in the third direction DR3 or a sidewall extending in the fourth direction DR4.

The connecting sidewall 220sc may overlap a portion of the second lower electrodes 210 that is in contact with the third electrode support 220 in the first direction DR1. The connecting sidewall 220sc may overlap a portion of the second lower electrodes 210 that is in contact with the third electrode support 220 in the second direction DR2.

For example, between the connecting sidewall 320sc of the third electrode support extending in the third direction DR3 and the connecting sidewall 220sc of the third electrode support extending in the fourth direction DR4, at least one group of the first lower electrodes 110, arranged in the first direction DR1, may be positioned.

Alternatively, or additionally, between the connecting sidewall 220sc extending in the third direction DR3 and the connecting sidewall 220sc extending in the fourth direction DR4, a portion of the group of the second lower electrodes 210, arranged in the second direction DR2, may be positioned.

The third electrode support 220 may include a first boundary side 220ba defined by the first sidewall 220sa of the third electrode support 220, a second boundary side 220bb defined the second sidewall 220sb of the third electrode support 220, and a connecting boundary side 220bc defined by the connecting sidewall 220sc of the third electrode support 220.

The third electrode support 220 may include a third inner support region 221 formed with a third through pattern 225, and a third outer support region 222 not formed with the third through pattern 225. In other words, the third through pattern 225 may be a hole or an opening of the third electrode support 220.

The third outer support region 222 may be disposed along a periphery of the third inner support region 221. Accordingly, a boundary of the third electrode support 220 may be defined by the third outer support region 222.

The third outer support region 222 may include the first sidewall 220sa of the third electrode support 220, the second sidewall 220sb of the third electrode support 220, and the connecting sidewall 220sc of the third electrode support 220.

For example, among a plurality of the second lower electrodes 210 arranged in a row in the first direction DR1, at least two second lower electrodes 210 disposed on the opposite ends of the row may be in contact with the third outer support region 222.

Further, among a plurality of the second lower electrodes 210 arranged in a column in the second direction DR2, at least two second lower electrodes 210 disposed on the opposite ends of the column may be in contact with the third outer support region 222.

In the third outer support region 222, not overlapping the third inner support region 221 in the first direction DR1 and the second direction DR2, the third outer support region 222 that includes the connecting sidewall 220sc may include a portion in which a width D8 of the first direction DR1 decreases as a distance from the third inner support region 221 increases.

Further, in the third outer support region 222, not overlapping the third inner support region 221 in the first direction DR1 and the second direction DR2, the third outer support region 222 that includes the connecting sidewall 220sc may include a portion in which a width D9 of the second direction DR2 decreases as a distance from the third inner support region 221 increases.

While FIGS. 16 and 17 illustrate that a shape of an upper surface of the third electrode support 220 is same as a shape of the upper surface of the first electrode support 120, this is merely exemplary, and exemplary embodiments of the inventive concept are not limited hereto.

Further, when the second electrode support 130 of FIG. 11 is additionally formed between the first electrode support 120 and the substrate 100, a fourth electrode support may be formed between the third electrode support 220 and the substrate 100. The fourth electrode support may be formed at a height corresponding to the height of the second electrode support 130.

Figure 18:
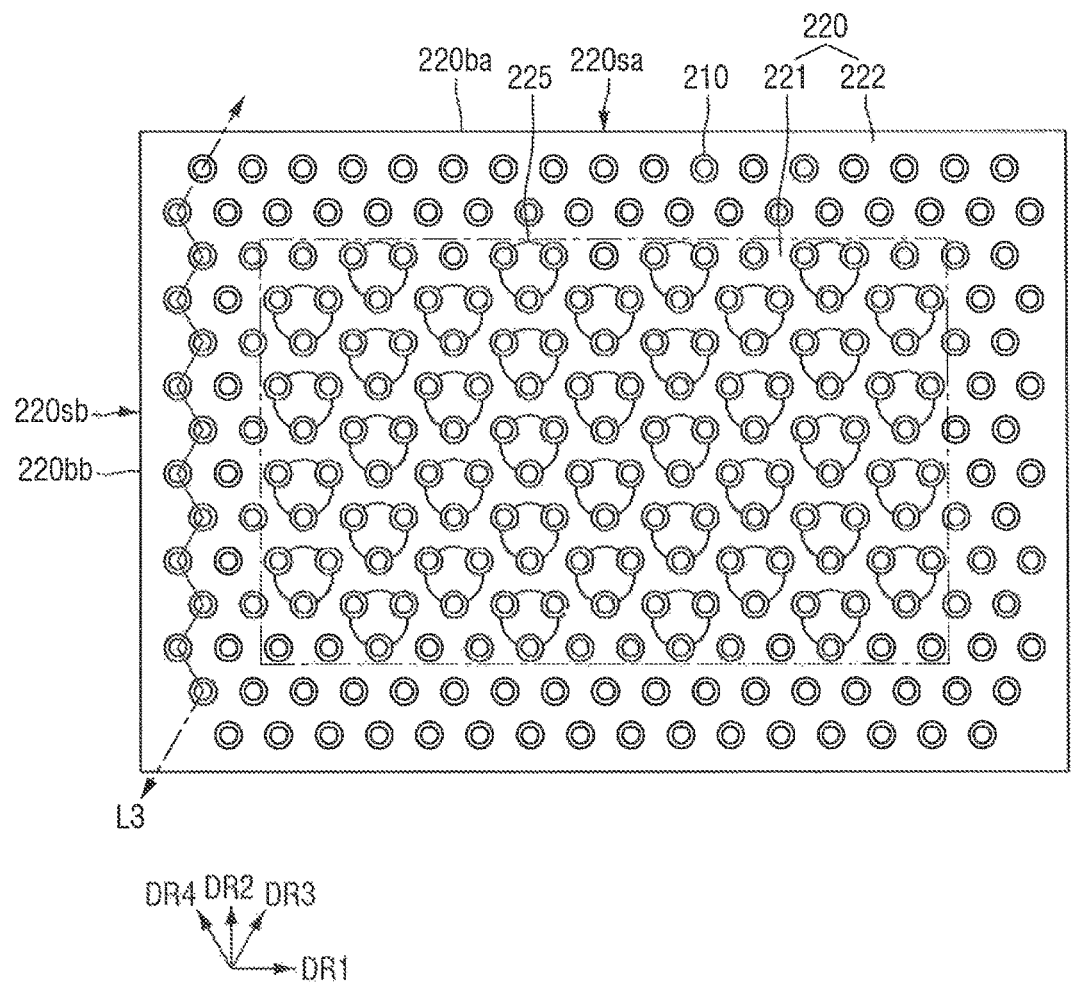
FIG. 18 is a plan view illustrating a lower electrode and an electrode support of a semiconductor device according to an exemplary embodiment of the inventive concept.
Figure 19:
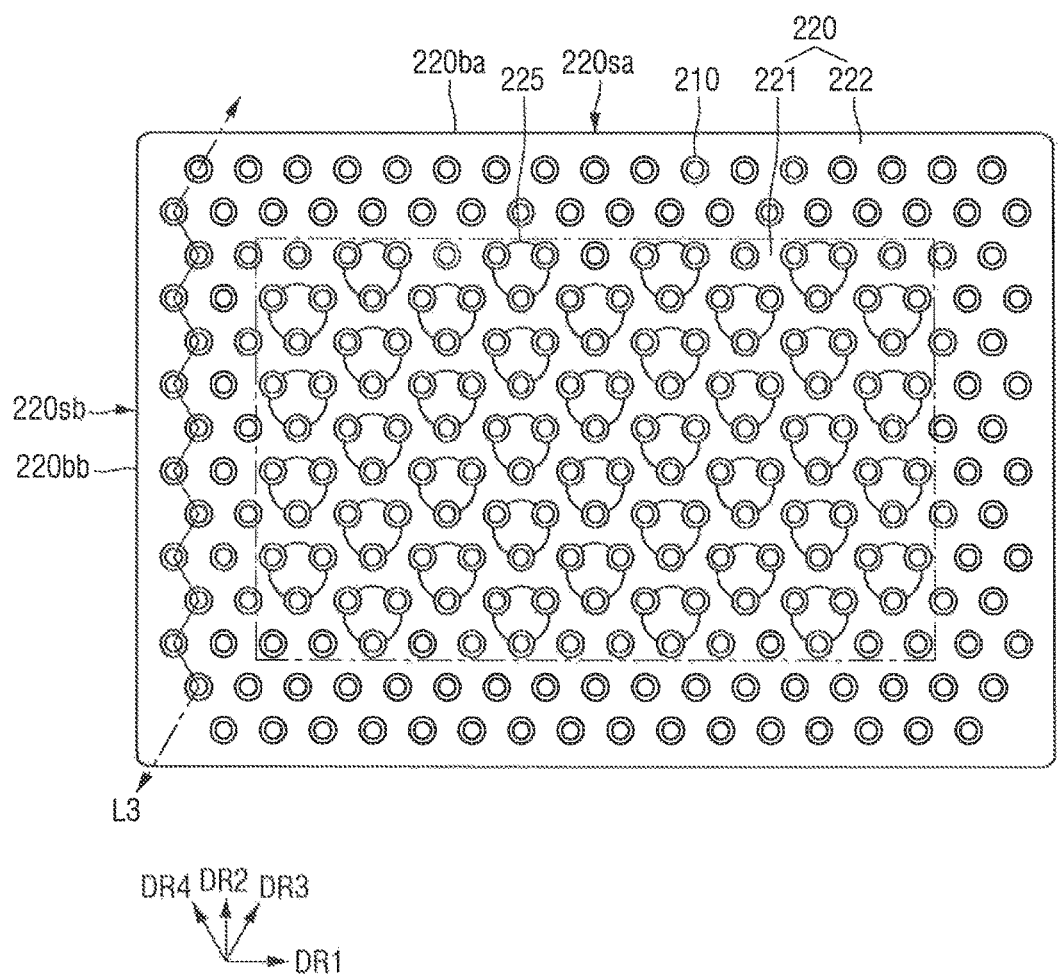
FIG. 19 is a plan view illustrating a lower electrode and an electrode support of a semiconductor device according to an exemplary embodiment of the inventive concept.

FIG. 18 is a plan view illustrating a lower electrode and an electrode support of a semiconductor device according to an exemplary embodiment of the inventive concept. FIG. 19 is a plan view illustrating a lower electrode and an electrode support of a semiconductor device according to an exemplary embodiment of the inventive concept. For convenience of explanation, differences between FIGS. 18 and 19 and FIGS. 15 to 17 may be described below.

Referring to FIGS. 18 and 19, in a semiconductor device, according to exemplary embodiments of the inventive concept, the third electrode support 220 may not include the connecting sidewall for connecting the first sidewall 220sa of the third electrode support 220 with the second sidewall 220sb of the third electrode support 220.

The first sidewall 220sa of the third electrode support 220 may meet the second sidewall 220sb of the third electrode support 220 to form a corner.

Accordingly, an outer sidewall of the third electrode support 220 may not have a shape corresponding to the shape of the outer sidewall of the first electrode support 120.

In FIG. 18, the edge of the third electrode support 220, which is formed as a result of the first sidewall 220sa meeting the second sidewall 220sb, may have an angular/corner shape.

In FIG. 19, the edge of the third electrode support 220, which is formed as a result of the first sidewall 220sa of the third electrode support 220 meeting the second sidewall 220sb of the third electrode support 220, may be rounded/curved.

Note that, between the rounded/curved portions facing each other in the first direction DR1 in the edge of the third electrode support 220, at least one group of the second lower electrodes 210 arranged in the first direction DR1 may not be positioned. In the edge of the third electrode support 220, a width of the rounded/curved portions in the second direction DR2 may be less than a width of the second lower electrodes 210 in the second direction DR2.

Further, between the rounded/curved portions facing each other in the second direction DR2 in the edge of the third electrode support 220, a group of the second lower electrodes 210 arranged in the second direction DR2 may not be positioned. In other words, the rounded/curved portions of the third electrode support 220 may be smaller than a width of the second lower electrodes 210.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
a substrate;
a plurality of lower electrodes disposed on the substrate, wherein individual lower electrodes of the plurality of lower electrodes are repeatedly arranged in a first direction and in a second direction that crosses the first direction; and
a first electrode support contacting a sidewall of at least one of the lower electrodes to support the at least one of the lower electrodes,
wherein the first electrode support comprises a first support region and a second support region disposed at a border of the first support region, wherein the first support region includes a first opening,
wherein an outer sidewall of the first electrode support comprises first sidewalls extending in the first direction, second sidewalls extending in the second direction, and four connecting sidewalls connecting the first sidewalls with the second sidewalls,
wherein the second support region comprises the connecting sidewalls, and
wherein each of boundaries of an upper surface of the first electrode support, corresponding to at least two of the connecting sidewalls has one of a line shape extending in a third direction crossing the first and second directions, a curved shape, and a zigzag shape.

2. The semiconductor device of claim 1, wherein each of the boundaries of the upper surface of the first electrode support, corresponding to the at least two of the connecting sidewalls has the line shape extending in the third direction.

3. The semiconductor device of claim 1, wherein each of the boundaries of the upper surface of the first electrode support, corresponding to the at least two of the connecting sidewalls has the curved shape.

4. The semiconductor device of claim 1, wherein the zigzag shape has a first partial line extending in a fourth direction, and a second partial line extending in a fifth direction, and
wherein a corner where the first partial line and second partial line meet is rounded.

5. The semiconductor device of claim 1, each of boundaries of the upper surface of the first electrode support, corresponding to four of the connecting sidewalls has one of the line shape extending in the third direction, the curved shape and the zigzag shape.

6. The semiconductor device of claim 1, wherein the lower electrodes comprise a first row of the lower electrodes, a second row of the lower electrodes and a third row of the lower electrodes consecutively arranged,
wherein each of the first, second and third rows of the lower electrodes extends in the first direction, and
wherein the first and second directions are perpendicular to each other,
wherein a first line that extends in the first direction passes through each lower electrode of the second row of the lower electrodes, and
wherein a second line that extends in the second direction passes through one of the lower electrodes of the first row of the low electrodes, through one of the lower electrodes of the third row of the low electrodes, but not through one of the lower electrodes of the second row of the low electrodes.

7. The semiconductor device of claim 1, wherein the lower electrodes comprise a first row of the lover electrodes, a second row of the lower electrodes, and a third row of the lower electrodes consecutively arranged,
wherein each of the first, second, and third rows of the lower electrodes extends in the first direction, and
wherein the first and second directions are perpendicular to each other,
wherein a first line that extends in the first direction passes through each lower electrode of the second row of the lower electrodes, and
wherein a second line that extends in the second direction passes through one of the lower electrodes of the first row of the low electrodes, through one of the lower electrodes of the second row of the low electrodes, through one of the lower electrodes of the third row of the low electrodes.

8. The semiconductor device of claim 1, wherein each of the boundaries of the upper surface of the first electrode support, corresponding to the at least two of the connecting sidewalls has one of the line shape extending in the third direction, and the zigzag shape, and
wherein a first corner where the at least two of the connecting sidewalls and the first sidewalls meet, and a second corner where the at least two of the connecting sidewalls and the second sidewalls meet are rounded.

9. The semiconductor device of claim 1, further comprising a second electrode support disposed between the substrate and the first electrode support,
wherein the second electrode support is in contact with the sidewall of the at least one of the lower electrodes to support the at least one of the lower electrodes.

10. A semiconductor device, comprising:
a substrate;
a plurality of lower electrodes disposed on the substrate; and
an electrode support contacting a sidewall of at least one of the lower electrodes to support the at least one of the lower electrodes,
wherein an outer sidewall of the electrode support comprises first and second sidewalls extending in a first direction, a third sidewall extending in a second direction, and a first connecting sidewall connecting the first sidewall with the third sidewall, and wherein the first and second directions are perpendicular to each other,
wherein the lower electrodes comprise a first group of the lower electrodes and a second group of the lower electrodes consecutively arranged in the first direction,
wherein each of the first and second groups of the lower electrodes is arranged in a zigzag manner along the second direction,
wherein the first group of the lower electrodes comprises a first lower electrode and a second lower electrode which are closest to each other,
wherein a first line that extends in a third direction different from the first and second directions passes through the first lower electrode and the second lower electrode, and
wherein the first connecting sidewall is substantially parallel with the first line.

11. The semiconductor device of claim 10, wherein the outer sidewall of the electrode support further includes a second connecting sidewall connecting the second sidewall with the third sidewall, and
wherein boundary of an upper surface of the electrode support, corresponding to the second connecting sidewall has one of a line shape extending in a third direction crossing the first, second and third directions, a curved shape, and a zigzag shape.

12. The semiconductor device of claim 10, wherein the outer sidewall of the electrode support further includes a second connecting sidewall connecting the second sidewall with the third sidewall,
wherein the first group of the lower electrodes comprises a third lower electrode which is closest to the first lower electrode,
wherein the first lower electrode is positioned between the second electrode and the third lower electrode,
wherein a second line that extends in a fourth direction different from the first, second and third directions passes through the first lower electrode and the third lower electrode, and
wherein the second connecting sidewall is substantially parallel with the second line.

13. The semiconductor device of claim 10, wherein a corner Where the first connecting sidewall and the first sidewall meet is rounded.

14. The semiconductor device of claim 10, wherein the lower electrodes comprise a first row of the lower electrodes, a second row of the lower electrodes and a third row of the lower electrodes consecutively arranged in the second direction,
wherein each of the first, second and third rows of the lower electrodes extends in the first direction,
wherein a second line that extends in the first direction passes through each lower electrode of the second row of the lower electrodes, and
wherein a third line that extends in the second direction passes through one of the lower electrodes of the first row of the low electrodes, through one of the lower electrodes of the third row of the low electrodes, but not through one of the lower electrodes of the second row of the low electrodes.

15. The semiconductor device of claim 10, wherein the lower electrodes comprise a first row of the lower electrodes, a second row of the lower electrodes, and a third row of the lower electrodes consecutively arranged in the second direction,
  wherein each of the first, second, and third rows of the lower electrodes extends in the first direction, and wherein the first and second directions are perpendicular to each other,
  wherein a second line that extends in the first direction passes through each lower electrode of the second row of the lower electrodes, and
  wherein a third line that extends in the second direction passes through one of the lower electrodes of the first row of the low electrodes, through one of the lower electrodes of the second row of the low electrodes, through one of the lower electrodes of the third row of the low electrodes.

16. The semiconductor device of claim 10, wherein electrode support includes an opening.

17. A semiconductor device, comprising:
  a substrate;
  a plurality of lower electrodes disposed on the substrate, wherein individual lower electrodes of the plurality of lower electrodes are repeatedly arranged in a first direction and in a second direction that crosses the first direction;
  a first electrode support contacting a sidewall of at least one of the lower electrodes to support the at least one of the lower electrodes; and
  a second electrode support disposed between the substrate and the first electrode support, wherein the second electrode support is in contact with the sidewall of the at least one of the lower electrodes to support the at least one of the lower electrodes,
  wherein the first electrode support comprises a first support region and a second support region disposed at a border of the first support region, wherein the first support region includes a first opening,
  wherein an outer sidewall of the first electrode support comprises a first sidewall extending in the first direction, a second sidewall extending in the second direction, and a connecting sidewall connecting the first sidewall with the second sidewall,
  wherein the second support region comprises the connecting sidewall,
  wherein, in a first portion of the second support region, a width of the first portion of the second support region decreases in a direction away from the first support region,
  wherein a width of the second electrode support in the first direction is different from a corresponding width of the first electrode support in the first direction, and
  wherein a width of the second electrode support in the second direction is different from a corresponding width of the first electrode support in the second direction.

18. The semiconductor device of claim 17, wherein a boundary of an upper surface of the first electrode support, corresponding to the connecting sidewall has one of a line shape extending in a third direction crossing the first and second directions, a curved shape, and a zigzag shape.

19. The semiconductor device of claim 17, wherein an outer sidewall of the second electrode support has a shape corresponding to a shape of the outer sidewall of the first electrode support.

20. The semiconductor device of claim 17, wherein the lower electrodes comprise a first row of the lower electrodes, a second row of the lower electrodes and a third row of the lower electrodes consecutively arranged in the second direction,
  wherein each of the first, second and third rows of the lower electrodes extends in the first direction, and wherein the first and second directions are perpendicular to each other,
  wherein a first line that extends in the first direction passes through each lower electrode of the second row of the lower electrodes, and
  wherein a second line that extends in the second direction passes through one of the lower electrodes of the first row of the low electrodes, through one of the lower electrodes of the third row of the low electrodes, but not through one of the lower electrodes of the second row of the low electrodes.

* * * * *